US012777755B2

(12) United States Patent
Eom et al.

(10) Patent No.: US 12,777,755 B2
(45) Date of Patent: Oct. 27, 2026

(54) DISPLAY DEVICE

(71) Applicant: LG Display Co., Ltd., Seoul (KR)

(72) Inventors: Hyeseon Eom, Seoul (KR); Minseok Kim, Seoul (KR); Sumin Lee, Seoul (KR)

(73) Assignee: LG Display Co., Ltd. (KR)

(*) Notice: Subject to any disclaimer, the term of this patent is extended or adjusted under 35 U.S.C. 154(b) by 350 days.

(21) Appl. No.: 18/209,555

(22) Filed: Jun. 14, 2023

(65) Prior Publication Data

US 2024/0186471 A1 Jun. 6, 2024

(30) Foreign Application Priority Data

Dec. 6, 2022 (KR) ........................ 10-2022-0169011

(51) Int. Cl.

*H10H 20/857* (2025.01)
*G09G 3/00* (2006.01)
*H10W 90/00* (2026.01)

(52) U.S. Cl.

CPC ........... *H10H 20/857* (2025.01); *G09G 3/006* (2013.01); *H10W 90/00* (2026.01); *G09G 2330/10* (2013.01); *G09G 2330/12* (2013.01)

(58) Field of Classification Search

CPC .. H10H 20/857; G09G 3/006; G09G 2330/10; G09G 2330/12; H01L 25/0753; H01L 25/167
USPC .......................................................... 313/500
See application file for complete search history.

(56) References Cited

U.S. PATENT DOCUMENTS

2018/0175268 A1 6/2018 Moon et al.
2020/0005706 A1* 1/2020 Li ...................... G06V 40/1318
2020/0211451 A1* 7/2020 Akimoto .................. G09G 3/32
2021/0043616 A1 2/2021 Jung et al.
2021/0296293 A1 9/2021 Kanaya et al.
2021/0296537 A1* 9/2021 Lee ...................... H10H 20/853
(Continued)

FOREIGN PATENT DOCUMENTS

JP S57-7453 U 6/1980
JP 2003-309293 A 10/2003
(Continued)

OTHER PUBLICATIONS

K-PION Patent File Wrapper Search (Year: 2022).*
(Continued)

*Primary Examiner* — James R Greece
*Assistant Examiner* — Hana S Featherly
(74) *Attorney, Agent, or Firm* — Fish & Richardson P.C.

(57) ABSTRACT

A display device includes a substrate including a plurality of sub-pixels, a pixel circuit disposed in each of the plurality of sub-pixels on the substrate, a first light emitting element disposed in each of the plurality of sub-pixels, disposed on one side of the pixel circuit, and including a first electrode, a semiconductor layer, and a second electrode, a second light emitting element disposed in each of the plurality of sub-pixels, disposed on the other side of the pixel circuit, and including a first electrode, a semiconductor layer, and a second electrode and a pixel electrode electrically connected to the pixel circuit and extending to the first light emitting element and the second light emitting element, thus a defective light emitting element of the sub-pixel can be easily repaired.

20 Claims, 15 Drawing Sheets

(56) References Cited

U.S. PATENT DOCUMENTS

| | | | |
|---|---|---|---|
| 2022/0157914 | A1 | 5/2022 | Kim et al. |
| 2022/0246792 | A1 | 8/2022 | Liao et al. |
| 2022/0320055 | A1 | 10/2022 | Choi et al. |

FOREIGN PATENT DOCUMENTS

| | | | |
|---|---|---|---|
| JP | 2006-065011 | A | 3/2006 |
| JP | 2020-008751 | A | 1/2020 |
| JP | 2020-86154 | A | 6/2020 |
| JP | 2021-099494 | A | 7/2021 |
| JP | 2022-000703 | A | 1/2022 |
| JP | 2023-520088 | A | 5/2023 |
| KR | 10-2014-0137272 | A | 12/2014 |
| KR | 10-2015-0066971 | A | 6/2015 |
| KR | 10-2018-0004247 | A | 1/2018 |
| TW | 202127119 | A | 7/2021 |
| WO | 2017/115210 | A1 | 7/2017 |
| WO | 2020/217959 | A1 | 10/2020 |

OTHER PUBLICATIONS

European Search Report from the EPO dated May 27, 2024 issued in Patent Application No. 23188037.8 (10 pages).
Taiwanese Office Action dated Aug. 2, 2024 issued in Patent Application No. 112138560 w/English translation (8 pages).
Japanese Office Action dated Jul. 24, 2024 issued in Patent Application No. 2023-142756 w/English translation (6 pages).

* cited by examiner

DISPLAY DEVICE

CROSS-REFERENCE TO RELATED APPLICATION

This application claims the priority of Korean Patent Application No. 10-2022-0169011 filed on Dec. 6, 2022, which is hereby incorporated by reference in its entirety.

BACKGROUND

Field of the Disclosure

The present disclosure relates to a display device, and more particularly, to a display device that can be repaired through a repair process.

Description of the Background

Display devices used in computer monitors, TVs, and mobile phones include organic light emitting displays (OLED) that emit light by themselves, and liquid crystal displays (LCDs) that require a separate light source.

Display devices have been applied to more and more various fields of applications including not only computer monitors and TVs, but also personal mobile devices, and thus, display devices having a reduced volume and weight while having a wide active area have been studied.

In recent years, display devices including light emitting diodes (LED) have drawn attention as next-generation display devices. Since the LED is formed of an inorganic material rather than an organic material, it has excellent reliability and a longer lifespan compared to a liquid crystal display or an organic light emitting display. In addition, the LED has a high lighting speed, a high luminous efficiency and an excellent stability due to a high impact resistance and may display a high-luminance image.

SUMMARY

Accordingly, the present disclosure is directed to a display device that substantially obviates one or more of problems due to limitations and disadvantages described above.

More specifically, the present disclosure is to provide a display device capable of easily darkening a defective sub-pixel.

The present disclosure is also to provide a display device in which a light emitting element of a sub-pixel in which a color mixing defect occurs can be repaired through a welding process.

Further, the present disclosure is to provide a display device capable of easily connecting a light emitting element connected to a defective pixel circuit and a light emitting element of a sub-pixel in which a color mixing defect occurs to a normally driven pixel circuit using an assembly electrode.

The present disclosure is not limited to the above-mentioned features, and other features, which are not mentioned above, may be clearly understood by those skilled in the art from the following descriptions.

According to an aspect of the present disclosure, a display device includes a substrate including a plurality of sub-pixels, a pixel circuit disposed in each of the plurality of sub-pixels on the substrate, a first light emitting element disposed in each of the plurality of sub-pixels, disposed on one side of the pixel circuit, and including a first electrode, a semiconductor layer, and a second electrode, a second light emitting element disposed in each of the plurality of sub-pixels, disposed on the other side of the pixel circuit, and including a first electrode, a semiconductor layer, and a second electrode and a pixel electrode electrically connected to the pixel circuit and extending to the first light emitting element and the second light emitting element. Therefore, it is possible to easily repair a light emitting element of the sub-pixel where the defect occurs.

Other detailed matters of the exemplary aspects are included in the detailed description and the drawings.

According to the present disclosure, a defective sub-pixel may be darkened by a welding process, and a repair process may be performed thereon.

According to the present disclosure, even if light emitting elements are disposed in undesired sub-pixels due to different sizes of the light emitting elements, the corresponding light emitting elements may be normally used.

According to the present disclosure, a light emitting element of a defective sub-pixel may be easily connected to a pixel circuit of a normal sub-pixel using an assembly electrode.

According to the present disclosure, since a repair process is performed using an assembly electrode and a pixel electrode without a separate structure for the repair process, a structure of a display device may be simplified.

The effects according to the present disclosure are not limited to the contents exemplified above, and more various effects are included in the present specification.

BRIEF DESCRIPTION OF THE DRAWINGS

The accompanying drawings, which are included to provide a further understanding of the disclosure and are incorporated in and constitute a part of the disclosure, illustrate aspects of the disclosure and together with the description serve to explain the principle of the disclosure.

In the drawings.

DETAILED DESCRIPTION

Figure 1:
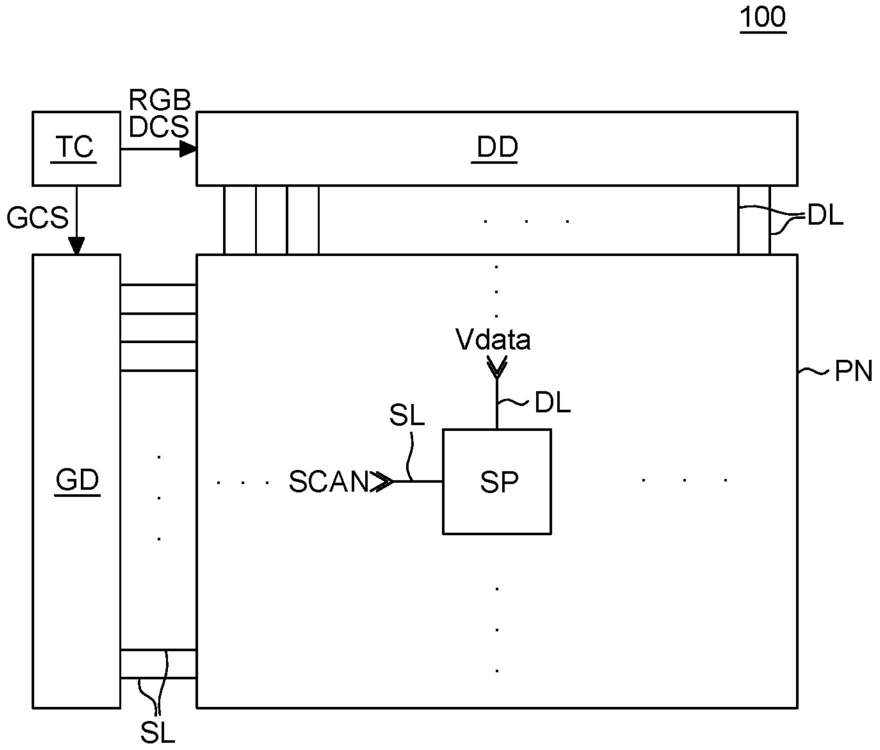
FIG. 1 is a schematic configuration diagram of a display device according to an exemplary aspect of the present disclosure.

Advantages and characteristics of the present disclosure and a method of achieving the advantages and characteristics will be clear by referring to exemplary aspects described below in detail together with the accompanying drawings. However, the present disclosure is not limited to the exemplary aspects disclosed herein but will be implemented in various forms. The exemplary aspects are provided by way of example only so that those skilled in the art may fully understand the disclosures of the present disclosure and the scope of the present disclosure.

The shapes, sizes, ratios, angles, numbers, and the like illustrated in the accompanying drawings for describing the exemplary aspects of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" another element or layer, another layer or another element may be interposed directly on the other element or therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

The size and a thickness of each component illustrated in the drawing are illustrated for convenience of description, and the present disclosure is not limited to the size and the thickness of the component illustrated.

The features of various aspects of the present disclosure may be partially or entirely adhered to or combined with each other and may be interlocked and operated in technically various ways, and the aspects may be carried out independently of or in association with each other.

Hereinafter, a display device according to exemplary aspects of the present disclosure will be described in detail with reference to accompanying drawings.

FIG. 1 is a schematic configuration diagram of a display device according to an exemplary aspect of the present disclosure.

In FIG. 1, a display panel PN, a gate driver GD, a data driver DD, and a timing controller TC among various components of a display device 100 are illustrated only for convenience of description.

Referring to FIG. 1, the display device 100 includes the display panel PN including a plurality of sub-pixels SP, the gate driver GD and the data driver DD for supplying various signals to the display panel PN, and the timing controller TC for controlling the gate driver GD and the data driver DD.

The display panel PN, a component for displaying an image, includes the plurality of sub-pixels SP. In the display panel PN, the plurality of scan lines SL and the plurality of data lines DL cross each other, and each of the plurality of sub-pixels SP is connected to the scan line SL and the data line DL. In addition, each of the plurality of sub-pixels SP may be connected to high potential power supply lines VDD (shown in FIG. 2), low potential power supply lines VSS (not shown), reference lines RL (shown in FIG. 2), and the like.

The plurality of sub-pixels SP are minimum units constituting a screen, and each of the plurality of sub-pixels SP includes a light emitting element and a pixel circuit for driving the plurality of sub-pixels SP. A plurality of light emitting elements may be differently defined according to a type of display panel PN. For example, when the display panel PN is an inorganic light emitting display panel, the light emitting element may be a light emitting diode (LED) or a micro-light emitting diode (LED).

The gate driver GD supplies a plurality of scan signals SCAN to a plurality of scan lines SL according to a plurality of gate control signals GCS provided from the timing controller TC. Although it is illustrated in FIG. 1 that one gate driver GD is spaced apart from one side of the display panel PN, the number and arrangement of gate drivers GD are not limited thereto.

The data driver DD converts image data RGB input from the timing controller TC into a data voltage Vdata using a reference gamma voltage according to a plurality of data control signals DCS provided from the timing controller TC. The data driver DD may supply the converted data voltage Vdata to the plurality of data lines DL.

The timing controller TC aligns image data RGB input from the outside and supplies it to the data driver DD. The timing controller TC may generate a gate control signal GCS and a data control signal DCS using synchronization signals input from the outside, for example, a dot clock signal, a data enable signal, and a horizontal/vertical synchronization signal. In addition, the timing controller TC may supply the generated gate control signal GCS and data control signal DCS to the gate driver GD and the data driver DD, respectively, to thereby control the gate driver GD and the data driver DD.

Figure 2:
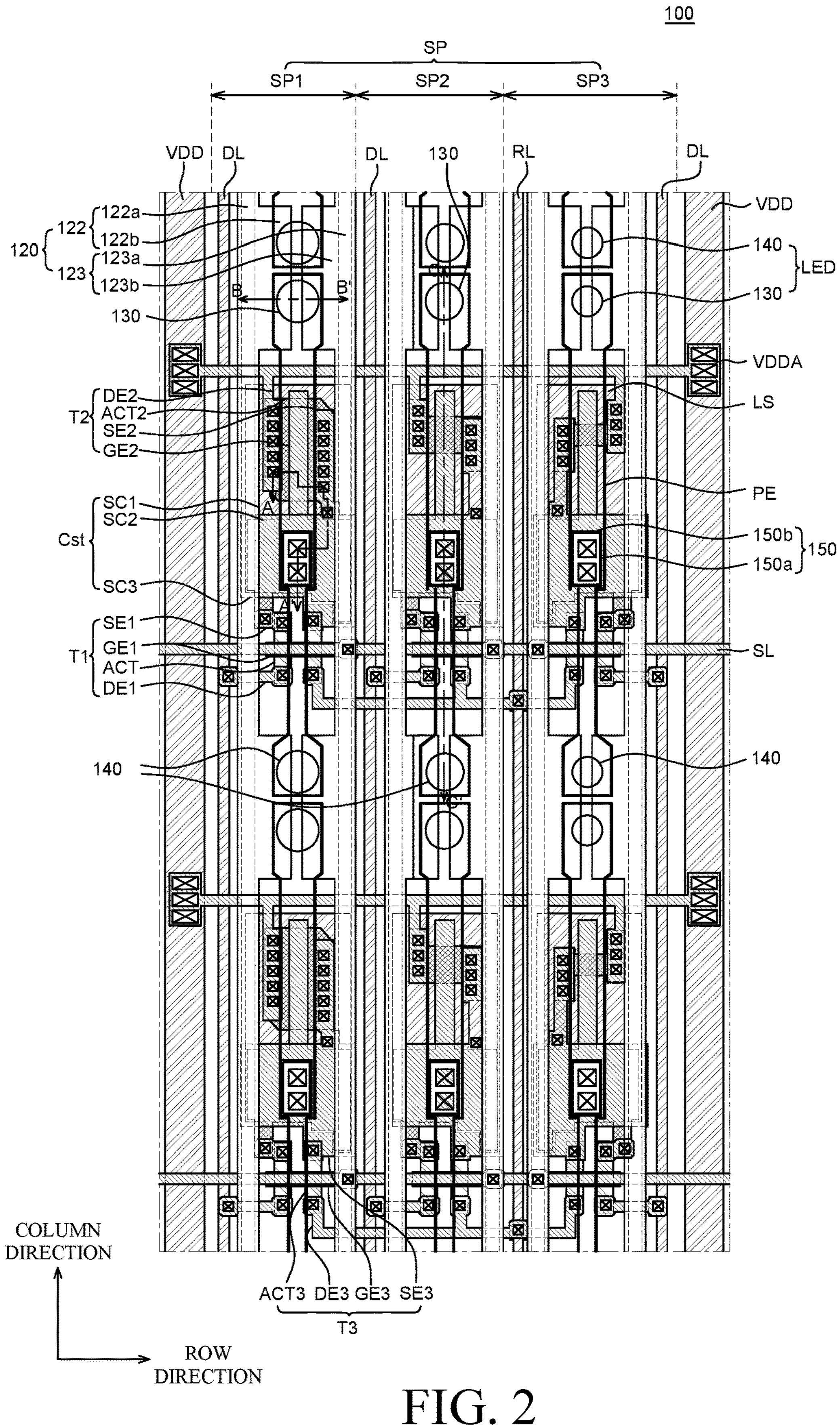
FIG. 2 is an enlarged plan view of the display device according to an exemplary aspect of the present disclosure.
Figure 3:
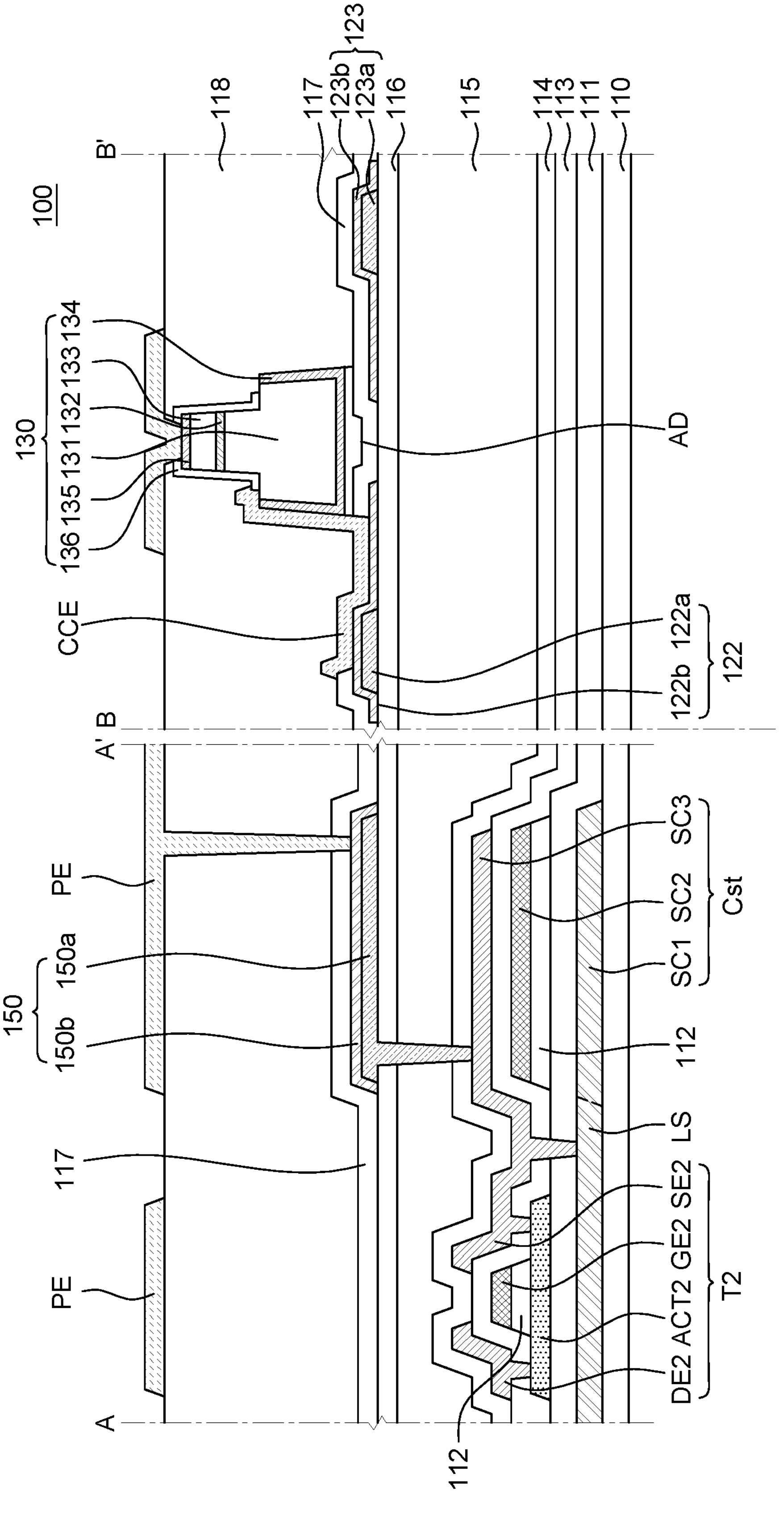
FIG. 3 is a cross-sectional view taken along lines A-A' and B-B' of FIG. 2.
Figure 4:
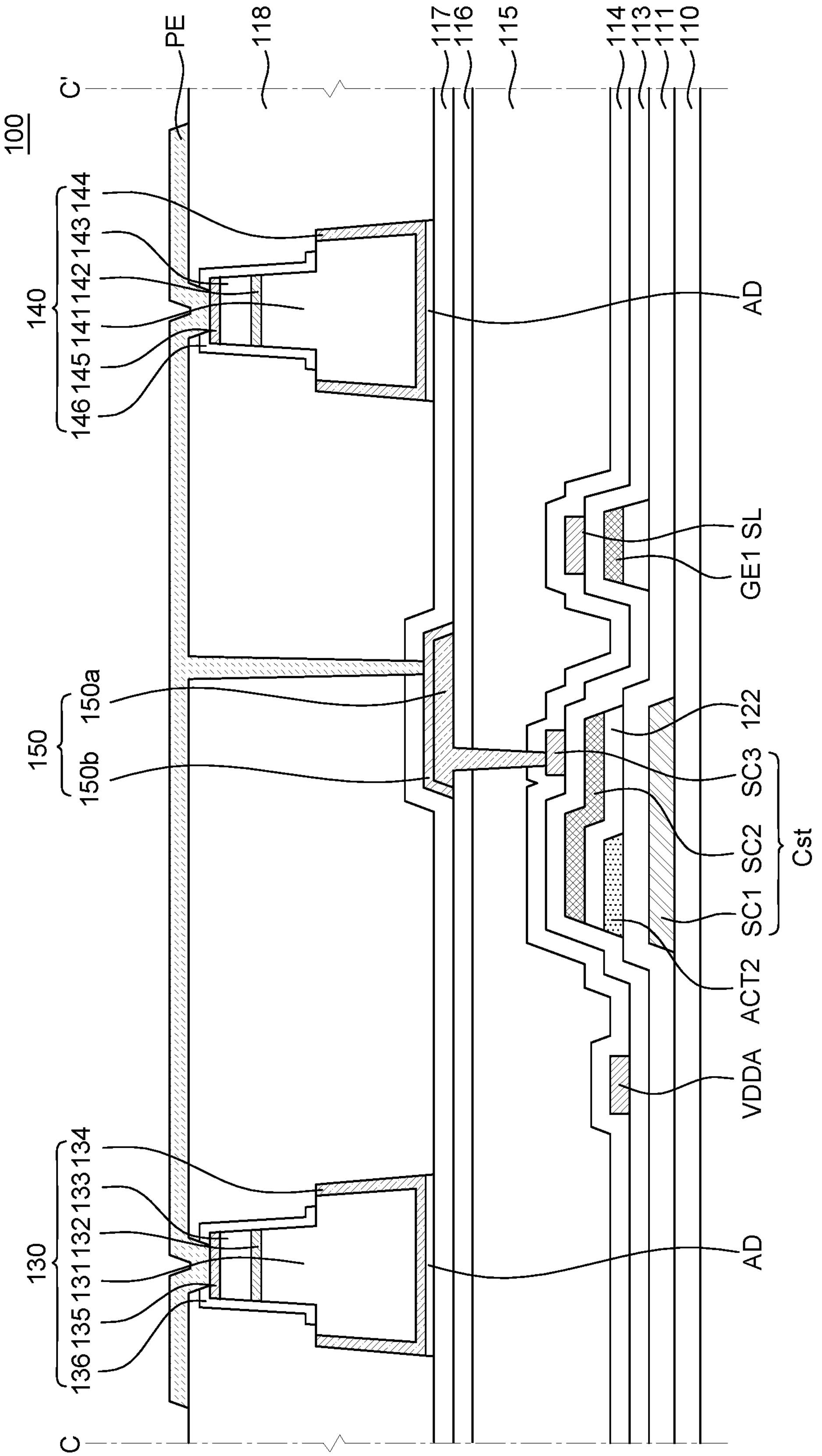
FIG. 4 is a cross-sectional view taken along line C-C' of FIG. 2.

Hereinafter, FIGS. 2 to 4 are also referred together for a more detailed description of the display panel PN of the display device 100.

FIG. 2 is an enlarged plan view of the display device according to an exemplary aspect of the present disclosure. FIG. 3 is a cross-sectional view taken along lines A-A' and B-B' of FIG. 2. FIG. 4 is a cross-sectional view taken along line C-C' of FIG. 2. Referring to FIG. 2, each of the plurality of sub-pixels SP includes a first transistor T1, a second transistor T2, a third transistor T3, a storage capacitor Cst, and one or more light emitting elements LED. In FIG. 3, hatchings of assembly electrodes 120, pixel electrodes PE, and the light emitting element LED will be omitted.

Referring to FIG. 2, in the display device 100, the plurality of sub-pixels SP include a first sub-pixel SP1 disposed in a first column, a second sub-pixel SP2 disposed in a second column, and a third sub-pixel SP3 disposed in a third column. The first sub-pixel SP1 disposed in the first column, the second sub-pixel SP2 disposed in the second column, and the third sub-pixel SP3 disposed in the third column are repeated in a row direction.

Each of the first sub-pixel SP1, the second sub-pixel SP2, and the third sub-pixel SP3 includes light emitting elements LED and a pixel circuit, and may independently emit light. For example, the first sub-pixel SP1 may be a red sub-pixel, the second sub-pixel SP2 may be a green sub-pixel, and the third sub-pixel SP3 may be a blue sub-pixel, but the present disclosure is not limited thereto. Also, the pixel circuit may include a first transistor T1, a second transistor T2, a third transistor T3, and a storage capacitor Cst.

The display panel PN includes a substrate 110, a buffer layer 111, a gate insulating layer 112, an interlayer insulating layer 113, a first passivation layer 114, a first planarization layer 115, a second passivation layer 116, a third passivation layer 117, and a second planarization layer 118.

The substrate 110 is a component to support various components included in the display panel PN and may be formed of an insulating material. For example, the substrate 110 may be formed of glass or resin. In addition, the substrate 110 may be formed of a polymer or plastic, or may be formed of a material having flexibility.

The high potential power supply lines VDD, the plurality of data lines DL, the reference lines RL, the assembly electrodes 120, a light blocking layer LS, and first capacitor electrodes SC1 are disposed on the substrate 110.

The high potential power supply line VDD is a line that transmits a high potential power supply voltage to each of the plurality of sub-pixels SP. The plurality of high potential power supply lines VDD may transmit high potential power supply voltages to the second transistors T2 of the plurality of respective sub-pixels SP. The high potential power supply line VDD may extend in a column direction between the plurality of sub-pixels SP. For example, the high potential power supply line VDD may be disposed in the column direction between the first sub-pixel SP1 and the third sub-pixel SP3. In addition, the high potential power supply line VDD may transmit a high potential power supply voltage to each of the plurality of sub-pixels SP disposed in a row direction through an auxiliary high potential power supply line VDDA, which will be described later. In this case, the high potential power supply line VDD may be referred to as a first power supply line. Also, the column direction may be referred to as a first direction, and the row direction may be referred to as a second direction.

The plurality of data lines DL are lines that transfer data voltages Vdata to each of the plurality of sub-pixels SP. The plurality of data lines DL may be connected to the first transistors T1 of the plurality of respective sub-pixels SP. The plurality of data lines DL may extend in the column direction between the plurality of sub-pixels SP. For example, the data line DL extending in the column direction between the first sub-pixel SP1 and the high potential power supply line VDD may transfer the data voltage Vdata to the first sub-pixel SP1, the data line DL disposed between the first sub-pixel SP1 and the second sub-pixel SP2 may transfer the data voltage Vdata to the second sub-pixel SP2, and the data line DL disposed between the third sub-pixel SP3 and the high potential power supply line VDD may transfer the data voltage Vdata to the third sub-pixel SP3.

The reference line RL is a line that transmits a reference voltage to each of the plurality of sub-pixels SP. The reference lines RL may be connected to the third transistors T3 of the plurality of respective sub-pixels SP. The reference line RL may extend in the column direction between the plurality of sub-pixels SP. For example, the reference line RL may extend in the column direction between the second sub-pixel SP2 and the third sub-pixel SP3. A third drain electrode DE3 of the third transistor T3 of each of the first sub-pixel SP1, the second sub-pixel SP2, and the third sub-pixel SP3 adjacent to the reference lines RL may extend in the row direction and be electrically connected to the reference line RL. In this case, the reference line RL may be referred to as a third power supply line.

The light blocking layer LS is disposed on the substrate 110 in each of the plurality of sub-pixels SP. The light blocking layer LS may block light incident on the transistor from a lower portion of the substrate 110 to minimize leakage current. For example, the light blocking layer LS may block light incident on a second active layer ACT2 of the second transistor T2 that is a driving transistor.

The first capacitor electrode SC1 is disposed on the substrate 110 in each of the plurality of sub-pixels SP. The first capacitor electrode SC1, together with other capacitor electrodes, may form the storage capacitor Cst. The first capacitor electrode SC1 may be integrally formed with the light blocking layer LS.

The buffer layer 111 is disposed on the high potential power supply lines VDD, the plurality of data lines DL, the reference lines RL, the light blocking layer LS, and the first capacitor electrodes SC1. The buffer layer 111 may reduce penetration of moisture or impurities through the substrate 110. The buffer layer 111 may be composed of, for example, a single layer or multiple layers of silicon oxide (SiOx) or silicon nitride (SiNx), but is not limited thereto. However, the buffer layer 111 may be omitted depending on a type of substrate 110 or a type of transistor, but is not limited thereto.

First, the first transistor T1 is disposed on the buffer layer 111 in each of the plurality of sub-pixels SP. The first transistor T1 transfers the data voltage Vdata to a second gate electrode GE2 of the second transistor T2. The first transistor T1 may be turned on by a scan signal from the scan line SL, and the data voltage Vdata from the data line DL may be transmitted to the second gate electrode GE2 of the second transistor T2 through the turned on first transistor T1. Accordingly, the first transistor T1 may be referred to as a switching transistor.

The first transistor T1 includes a first active layer ACT1, a first gate electrode GE1, a first source electrode SE1, and a first drain electrode DE1.

The first active layer ACT1 is disposed on the buffer layer 111. The first active layer ACT1 may be formed of a semiconductor material such as an oxide semiconductor, amorphous silicon, and polysilicon, but is not limited thereto.

The gate insulating layer 112 is disposed on the first active layer ACT1. The gate insulating layer 112 is an insulating layer for insulating the first active layer ACT1 and the first gate electrode GE1, and may be composed of a single layer or multiple layers of silicon oxide (SiOx) or silicon nitride (SiNx). However, the present disclosure is not limited thereto.

The first gate electrode GE1 is disposed on the gate insulating layer 112. The first gate electrode GE1 may be electrically connected to the scan line SL. The first gate electrode GE1 may be formed of a conductive material such as copper (Cu), aluminum (Al), molybdenum (Mo), nickel (Ni), titanium (Ti), and chromium (Cr), or an alloy thereof, but is not limited thereto.

The interlayer insulating layer 113 is disposed on the first gate electrode GE1. Contact holes for connecting each of the first source electrode SE1 and the first drain electrode DE1 to the first active layer ACT1 are formed in the interlayer insulating layer 113. The interlayer insulating layer 113 is an insulating layer for protecting components under the interlayer insulating layer 113, and may be composed of a single layer or multiple layers of silicon oxide (SiOx) or silicon nitride (SiNx), but is not limited thereto.

The first source electrode SE1 and the first drain electrode DE1 electrically connected to the first active layer ACT1 are disposed on the interlayer insulating layer 113. The first drain electrode DE1 may be connected to the data line DL and the first active layer ACT1, and the first source electrode SE1 may be connected to the first active layer ACT1 and the gate electrode GE2 of the second transistor T2. The first source electrode SE1 and the first drain electrode DE1 may be formed of a conductive material, for example, copper (Cu), aluminum (Al), molybdenum (Mo), nickel (Ni), titanium (Ti), chromium (Cr) or an alloy thereof, but is not limited thereto.

The second transistor T2 is disposed on the buffer layer 111 in each of the plurality of sub-pixels SP. The second transistor T2 is a transistor that supplies a driving current to the light emitting element LED. The second transistor T2 may be turned on to control a driving current flowing to the light emitting element LED. Accordingly, the second transistor T2 for controlling the driving current may be referred to as a driving transistor.

The second transistor T2 includes the second active layer ACT2, the second gate electrode GE2, a second source electrode SE2, and a second drain electrode DE2.

The second active layer ACT2 is disposed on the buffer layer 111. The second active layer ACT2 may be formed of a semiconductor material such as an oxide semiconductor, amorphous silicon, and polysilicon, but is not limited thereto.

The gate insulating layer 112 is disposed on the second active layer ACT2, and the second gate electrode GE2 is disposed on the gate insulating layer 112. The second gate electrode GE2 may be electrically connected to the first source electrode SE1 of the first transistor T1. The second gate electrode GE2 may be formed of a conductive material such as copper (Cu), aluminum (Al), molybdenum (Mo), nickel (Ni), titanium (Ti), and chromium (Cr), or an alloy thereof, but is not limited thereto.

The interlayer insulating layer 113 is disposed on the second gate electrode GE2, and the second source electrode SE2 and the second drain electrode DE2 electrically connected to the second active layer ACT2 are disposed on the interlayer insulating layer 113. The second drain electrode DE2 may be electrically connected to the second active layer ACT2 and the high potential power supply line VDD, and the second source electrode SE2 may be connected to the second active layer ACT2 and the light emitting element LED. The second source electrode SE2 and the second drain electrode DE2 may be formed of a conductive material, for example, copper (Cu), aluminum (Al), molybdenum (Mo), nickel (Ni), titanium (Ti), chromium (Cr) or an alloy thereof, but is not limited thereto.

The third transistor T3 is disposed on the buffer layer 111 in each of the plurality of sub-pixels SP. The third transistor T3 is a transistor for compensating a threshold voltage of the second transistor T2. The third transistor T3 is connected between the second source electrode SE2 of the second transistor T2 and the reference line RL. The third transistor T3 may be turned on and transfer a reference voltage to the second source electrode SE2 of the second transistor T2 to sense the threshold voltage of the second transistor T2. Accordingly, the third transistor T3 that senses characteristics of the second transistor T2 may be referred to as a sensing transistor.

The third transistor T3 includes a third active layer ACT3, a third gate electrode GE3, a third source electrode SE3, and the third drain electrode DE3.

The third active layer ACT3 is disposed on the buffer layer 111. The third active layer ACT3 may be formed of a semiconductor material such as an oxide semiconductor, amorphous silicon, and polysilicon, but is not limited thereto.

The gate insulating layer 112 is disposed on the third active layer ACT3, and the third gate electrode GE3 is disposed on the gate insulating layer 112. The third gate electrode GE3 may be electrically connected to the scan line SL. The third gate electrode GE3 may be formed of a conductive material such as copper (Cu), aluminum (Al), molybdenum (Mo), nickel (Ni), titanium (Ti), and chromium (Cr), or an alloy thereof, but is not limited thereto.

The interlayer insulating layer 113 is disposed on the third gate electrode GE3, and the third source electrode SE3 and the third drain electrode DE3 electrically connected to the third active layer ACT3 are disposed on the interlayer insulating layer 113. The third drain electrode DE3 may be electrically connected to the third active layer ACT3 and the reference line RL, and the third source electrode SE3 may be electrically connected to the third active layer ACT3 and the second source electrode SE2 of the second transistor T2. The third source electrode SE3 and the third drain electrode DE3 may be formed of a conductive material, for example, copper (Cu), aluminum (Al), molybdenum (Mo), nickel (Ni), titanium (Ti), chromium (Cr) or an alloy thereof, but is not limited thereto.

Both the first transistor T1 and the third transistor T3 illustrated in FIG. 2 are transistors controlled by being connected to the scan lines SL, but are not limited thereto. The pixel circuit may include transistors connected to an emission line to which an emission control signal is applied.

A second capacitor electrode SC2 is disposed on the gate insulating layer 112. The second capacitor electrode SC2 is one of electrodes forming the storage capacitor Cst and may be disposed to overlap with the first capacitor electrode SC1. The second capacitor electrode SC2 is integrally formed with the second gate electrode GE2 of the second transistor T2 and may be electrically connected to the second gate electrode GE2. The first capacitor electrode SC1 and the second capacitor electrode SC2 may be spaced apart from each other with the buffer layer 111 and the gate insulating layer 112 interposed therebetween.

In addition, the plurality of scan lines SL, the auxiliary high potential power supply line VDDA, and a third capacitor electrode SC3 are disposed on the interlayer insulating layer 113.

First, the scan line SL is a line that transmits a scan signal to each of the plurality of sub-pixels SP. The scan line SL may cross the plurality of sub-pixels SP and extend in the row direction. The scan line SL may be electrically connected to the first gate electrode GE1 of the first transistor T1 and the third gate electrode GE3 of the third transistor T3 of each of the plurality of sub-pixels SP.

The auxiliary high potential power supply line VDDA is disposed on the interlayer insulating layer 113. The auxiliary high potential power supply line VDDA may extend in the row direction and may be disposed across the plurality of sub-pixels SP. The auxiliary high potential power supply line VDDA may be electrically connected to the high potential power supply lines VDD extending in the column direction and the second drain electrodes DE2 of the second transistors T2 of the plurality of respective sub-pixels SP disposed in the row direction.

The third capacitor electrode SC3 is disposed on the interlayer insulating layer 113. The third capacitor electrode SC3 is an electrode forming the storage capacitor Cst, and may be disposed to overlap with the first capacitor electrode SC1 and the second capacitor electrode SC2. The third capacitor electrode SC3 may be integrally formed with the second source electrode SE2 of the second transistor T2 and electrically connected to the second source electrode SE2. Also, the second source electrode SE2 may also be electrically connected to the first capacitor electrode SC1 through a contact hole formed in the interlayer insulating layer 113 and the buffer layer 111. Accordingly, the first capacitor electrode SC1 and the third capacitor electrode SC3 may be electrically connected to the second source electrode SE2 of the second transistor T2.

The storage capacitor Cst may store a potential difference between the second gate electrode GE2 and the second source electrode SE2 of the second transistor T2 while the light emitting element LED emits light, so that a constant current is supplied to the light emitting element LED. The storage capacitor Cst includes the first capacitor electrode SC1 formed on the substrate 110 and connected to the second source electrode SE2, the second capacitor electrode SC2 formed on the buffer layer 111 and the gate insulating layer 112 and connected to the gate electrode GE2, and the third capacitor electrode SC3 formed on the interlayer insulating layer 113 and connected to the second source electrode SE2, so that the storage capacitor Cst may store a voltage between the second gate electrode GE2 and the second source electrode SE2 of the second transistor T2.

The first passivation layer 114 is disposed on the first transistor T1, the second transistor T2, the third transistor T3, and the storage capacitor Cst. The first passivation layer 114 is an insulating layer for protecting components under the first passivation layer 114, and may be composed of a single layer or multiple layers of silicon oxide (SiOx) or silicon nitride (SiNx), but is limited thereto.

The first planarization layer 115 is disposed on the first passivation layer 114. The first planarization layer 115 may planarize an upper portion of the substrate 110 on which the plurality of transistors T1, T2 and T3 and the storage capacitor Cst are disposed. The first planarization layer 115 may be composed of a single layer or multiple layers, and may be formed of, for example, photoresist or an acryl-based organic material, but is not limited thereto.

The second passivation layer 116 is disposed on the first planarization layer 115. The second passivation layer 116 is an insulating layer for protecting components under the second passivation layer 116, and may be composed of a single layer or multiple layers of silicon oxide (SiOx) or silicon nitride (SiNx), but is limited thereto.

Connection electrodes 150 and a plurality of the assembly electrodes 120 are disposed on the second passivation layer 116.

The connection electrode 150 is an electrode that electrically connects the second transistor T2 and the pixel electrode PE. The connection electrode 150 may be electrically connected to the second source electrode SE2 and the third capacitor electrode SC3 through a contact hole formed in the second passivation layer 116, the first planarization layer 115, and the first passivation layer 114.

The connection electrode 150 may have a multilayer structure including a first connection layer 150*a* and a second connection layer 150*b*. The first connection layer 150*a* is disposed on the second passivation layer 116, and the second connection layer 150*b* covering the first connection layer 150*a* is disposed. The second connection layer 150*b* may be disposed to surround both an upper surface and a side surface of the first connection layer 150*a*.

The second connection layer 150*b* is formed of a material that is more resistant to corrosion compared to the first connection layer 150*a*, and thus, may minimize a short circuit defect due to migration between the first connection layer 150*a* and adjacent lines when the display device 100 is manufactured. For example, the first connection layer 150*a* may be formed of a conductive material such as copper (Cu) and chromium (Cr), and the second connection layer 150*b* may be formed of molybdenum (Mo) or molybdenum titanium (MoTi), but the present disclosure is not limited thereto.

The plurality of assembly electrodes 120 are disposed on the second passivation layer 116.

The assembly electrodes 120 includes first assembly electrodes 122 and second assembly electrodes 123.

A plurality of the first assembly electrodes 122 and a plurality of the second assembly electrodes 123 may extend in the column direction in each of the first sub-pixel SP1, the second sub-pixel SP2, and the third sub-pixel SP3, and may be spaced apart from each other at regular intervals.

The first assembly electrode 122 may be disposed in an area corresponding to one side of the light emitting element LED. Among the assembly electrodes 120, the first assembly electrode 122 may be disposed in an area overlapping with the low potential power supply line and electrically connected to the low potential power supply line. The low potential power supply line is a line that transmits a low potential power supply voltage to the light emitting element LED. The low potential power supply line may extend in the column direction in each of the plurality of sub-pixels SP. For example, the low potential power supply line may be disposed in each of the first sub-pixel SP1, the second sub-pixel SP2, and the third sub-pixel SP3.

The second assembly electrode 123 may be spaced apart from the first assembly electrode 122 and disposed in an area corresponding to the other side of the light emitting element LED.

Each of the plurality of assembly electrodes 120 includes conductive layers 122*a* and 123*a* disposed on the second passivation layer 116 and cladding layers 122*b* and 123*b* disposed on the conductive layers 122*a* and 123*a* and covering both upper surfaces and side surfaces of the conductive layers 122*a* and 123*a*.

The first assembly electrode 122 includes a first conductive layer 122*a* and a first cladding layer 122*b*, and the second assembly electrode 123 includes a second conductive layer 123*a* and a second cladding layer 123*b*.

The first conductive layer 122*a* and the second conductive layer 123*a* may not overlap with the light emitting element LED. That is, end portions of the first conductive layer 122*a* and the second conductive layer 123*a* may be disposed outside an end portion of the light emitting element LED.

The first cladding layer 122*b* of the first assembly electrode 122 may be disposed to cover the upper and side surfaces of the first conductive layer 122*a*. In this case, the first cladding layer 122*b* and the second cladding layer 123*b* may extend from the end portions of the first conductive layer 122*a* and the second conductive layer 123*a* toward a central portion of the light emitting element LED and overlap with the light emitting element LED. For example, each of the first cladding layer 122*b* and the second cladding layer 123*b* may be disposed to overlap with an area corresponding to less than half of an area of a lower surface of the light emitting element LED.

The first conductive layer 122*a* and the second conductive layer 123*a* may be formed of the same material through the same process as the first connection layer 150*a* of the connection electrode 150. For example, the first conductive layer 122*a* and the second conductive layer 123*a* may be formed of a conductive material such as copper (Cu) and chromium (Cr). Also, the first cladding layer 122*b* and the second cladding layer 123*b* may be formed of the same material through the same process as the second connection layer 150*b* of the connection electrode 150. For example, the first cladding layer 122*b* and the second cladding layer 123*b* may be formed of a material that is more resistant to corrosion compared to the first conductive layer 122*a* and the second conductive layer 123*b*, for example, molybdenum (Mo), molybdenum titanium (MoTi) or the like, but the present disclosure is not limited thereto.

A third passivation layer 117 is disposed on the connection electrodes 150 and the assembly electrodes 120. The third passivation layer 117 is an insulating layer for protecting components under the third passivation layer 117, and may be composed of a single layer or multiple layers of silicon oxide (SiOx) or silicon nitride (SiNx), but is not limited thereto.

The plurality of light emitting elements LED are disposed on the third passivation layer 117.

The third passivation layer 117 may be opened in areas adjacent to the plurality of light emitting elements LED. For example, the third passivation layer 117 may be opened in areas adjacent to one side surfaces of both side surfaces of the plurality of light emitting elements LED. For example, the third passivation layer 117 may partially expose upper surfaces of the first assembly electrodes 122 in areas adjacent to one side surface of the plurality of light emitting elements LED.

The one or more light emitting elements LED are disposed in one sub-pixel SP on the third passivation layer 117. The light emitting element LED is an element that emits light by current. The light emitting elements LED may include light emitting elements LED that emit red light, green light, blue light, and the like, and through a combination thereof, may implement light of various colors including white light. In addition, light of various colors may be implemented by using the light emitting element LED that emits light of a specific color and a light conversion member that converts light from the light emitting element LED into light of a different color.

The light emitting element LED may emit light by receiving driving current from the second transistor T2. The size of the light emitting element LED may vary according to a type of the light emitting element LED. In this case, since the type of the light emitting element LED means a type of light emitted, the size of the light emitting element LED may vary depending on whether the light emitting element LED is a red light emitting element, a green light emitting element, or a blue light emitting element. The light emitting element may exhibit different luminous efficiency for each color it emits. Accordingly, the size of the light emitting elements LED may be determined according to the efficiency of the light emitting elements LED so that the light emitting elements emitting light of different colors may emit light with the same luminance.

For example, when luminous efficiency of a light emitting element emitting a specific color is relatively low, the light emitting element may emit light with the same luminance as other light emitting elements by forming it in a larger size than other light emitting elements. In FIG. 2, the size of the light emitting element LED disposed in the first sub-pixel SP1 is largest, the size of the light emitting element LED disposed in the second sub-pixel SP2 is smaller than the size of the light emitting element LED disposed in the first sub-pixel SP1, and the size of the light emitting element LED disposed in the third sub-pixel SP3 is smaller than the size of the light emitting element LED disposed in the second sub-pixel SP2. In this case, the light emitting element LED disposed in the first sub-pixel SP1 may be a red light emitting element, the light emitting element LED disposed in the second sub-pixel SP2 may be a green light emitting element, and the light emitting element LED disposed in the third sub-pixel SP3 may be a blue light emitting element, but the present disclosure is not limited thereto.

In this case, the plurality of light emitting elements LED disposed in one sub-pixel SP may be connected in parallel. That is, one electrode of each of the plurality of light emitting elements LED may be connected to the source electrode of the same second transistor T2, and the other electrode thereof may be connected to the same assembly electrode 120.

The light emitting elements LED may include a first light emitting element 130 and a second light emitting element 140. Meanwhile, the light emitting elements LED disposed in each of the plurality of sub-pixels SP may be spaced apart with the pixel circuit interposed therebetween. Specifically, the first light emitting element 130 may be disposed on one side of the pixel circuit, and the second light emitting element 140 may be disposed on the other side of the pixel circuit. For example, as illustrated in FIG. 2, the first light emitting element 130 may be disposed on an upper side of the pixel circuit, and the second light emitting element 140 may be disposed on a lower side of the pixel circuit.

The first light emitting element 130 may emit light of the same color as the second light emitting element 140. In this case, since the first light emitting element 130 and the second light emitting element 140 are the same type of light emitting elements LED, the size of the first light emitting element 130 may be identical to that of the second light emitting element 140. Here, the size of the light emitting element LED may mean the area of the lower surface of the light emitting element LED, a width of the light emitting element LED in cross-section, or a volume, a height, or the like of the light emitting element LED. However, the present disclosure is not limited thereto.

FIGS. 2 and 4 illustrate that two light emitting elements LED are disposed in each of the plurality of sub-pixels SP for convenience of description, but the number of the light emitting elements LED disposed in each of the plurality of sub-pixels SP is not limited thereto.

Referring to FIGS. 3 and 4, the light emitting element 130) includes a first semiconductor layer 131, a light emitting layer 132, a second semiconductor layer 133, a first electrode 134, a second electrode 135, and an encapsulation layer 136.

The first semiconductor layer 131 is disposed on the third passivation layer 117, and the second semiconductor layer 133 is disposed on the first semiconductor layer 131. The first semiconductor layer 131 and the second semiconductor layer 133 may be layers formed by doping a specific material with n-type impurities and p-type impurities. For example, each of the first semiconductor layer 131 and the second semiconductor layer 133 may be layers formed by doping materials such as gallium nitride (GaN), indium aluminum phosphide (InAlP), gallium arsenide (GaAs), and the like, with n-type impurities or p-type impurities. In addition, the p-type impurity may be magnesium (Mg), zinc (Zn), beryllium (Be) or the like, and the n-type impurity may be silicon (Si), germanium (Ge), tin (Sn) or the like, but the present disclosure is not limited thereto.

A portion of the first semiconductor layer 131 may protrude outside the second semiconductor layer 133. An upper surface of the first semiconductor layer 131 may include a portion overlapping with a lower surface of the second semiconductor layer 133 and a portion disposed outside the lower surface of the second semiconductor layer 133. However, sizes and shapes of the first semiconductor layer 131 and the second semiconductor layer 133 may be variously modified, but are not limited thereto.

The light emitting layer 132 is disposed between the first semiconductor layer 131 and the second semiconductor layer 133. The light emitting layer 132 may receive holes and electrons from the first semiconductor layer 131 and the second semiconductor layer 133 to emit light. The light emitting layer 132 may be formed of a single or multi-quantum well (MQW) structure, and may be formed of, for example, indium gallium nitride (InGaN) or gallium nitride (GaN), but the present disclosure is not limited thereto.

The first electrode 134 is disposed to surround a lower surface and a side surface of the first semiconductor layer 131. The first electrode 134 is an electrode for electrically connecting the first light emitting element 130*a* and the low potential power supply line VSS. The first electrode 134 may be formed of a conductive material, for example, a transparent conductive material such as indium tin oxide (ITO) and indium zinc oxide (IZO), or an opaque conductive material such as titanium (Ti), gold (Au), silver (Ag), and copper (Cu), or an alloy thereof, but the present disclosure is not limited thereto.

The second electrode 135 is disposed on an upper surface of the second semiconductor layer 133. The second electrode 135 is an electrode that electrically connects the pixel electrode PE, which will be described later, and the second semiconductor layer 133. The second electrode 135 may be formed of a conductive material, for example, a transparent conductive material such as indium tin oxide (ITO) and indium zinc oxide (IZO), but is not limited thereto.

The encapsulation layer 136 surrounding at least a portion of the first semiconductor layer 131, the light emitting layer 132, the second semiconductor layer 133, the first electrode 134, and the second electrode 135 is disposed. The encapsulation layer 136 may be formed of an insulating material and protect the first semiconductor layer 131, the light emitting layer 132, and the second semiconductor layer 133. The encapsulation layer 136 may be disposed to cover the light emitting layer 132, a portion of the side surface of the first semiconductor layer 131 adjacent to the light emitting layer 132, and a portion of a side surface of the second semiconductor layer 133 adjacent to the light emitting layer 132. The first electrode 134 and the second electrode 135 may be exposed from the encapsulation layer 136, and electrically connect the pixel electrode PE and the chip contact electrode CCE, which will be formed later, and the first electrode 134 and the second electrode 135.

An adhesive layer AD may be disposed between the plurality of light emitting elements LED, and the third passivation layer 117 and the assembly electrodes 120. The adhesive layer AD may be an organic film temporarily fixing the light emitting elements 130 during self-assembling of the light emitting elements LED. In manufacturing the display device 100, when an organic film covering the light emitting element LED is formed, a portion of the organic film may fill a space between the light emitting elements LED, and the third passivation layer 117 and the assembly electrodes 120 to temporarily fix the light emitting elements LED on the third passivation layer 117 and the assembly electrodes 120. Thereafter, even if the organic film is removed, a portion of the organic film permeated under the light emitting element LED may remain without being removed and become the adhesive layer. The adhesive layer AD may be formed of an organic material such as photoresist and an acryl-based organic material, but is not limited thereto.

The chip contact electrode CCE is disposed on one side of the light emitting element LED. The chip contact electrode CCE is an electrode for electrically connecting the light emitting element LED and the assembly electrode 120. The chip contact electrode CCE may be disposed to surround at least a portion of the first semiconductor layer 131 and the first electrode 134 of the light emitting element LED in an area overlapping with the first assembly electrode 122. In this case, the chip contact electrode CCE may be electrically connected to the first assembly electrode 122 exposed by the third passivation layer 117 in an area where the third passivation layer 117 is opened.

Meanwhile, the chip contact electrode CCE may not be disposed on the other side of the light emitting element LED. Accordingly, the first electrode 134 of the first light emitting element 130 and a first electrode 144 of the second light emitting element 140 are electrically connected to the first assembly electrode 122, and may not be connected to the second assembly electrode 123 and directly insulated from the second assembly electrode 123.

The second planarization layer 118 is disposed on the light emitting element LED and the chip contact electrode CCE. The second planarization layer 118 may planarize an upper portion of the substrate 110 on which the light emitting elements LED are disposed, and may fix the light emitting elements LED onto the substrate 110 together with the adhesive layer AD.

Accordingly, the second planarization layer 118 may be disposed to contact the chip contact electrode CCE on one side of the light emitting element LED, and may be disposed to contact the side surface of the light emitting element on the other side of the light emitting element LED.

Meanwhile, in the drawings, the second planarization layer 118 is illustrated as a single layer, but is not limited thereto, and the second planarization layer 118 may be composed of a single layer or multiple layers, for example, may be formed of photoresist or an acryl-based organic material, but is not limited thereto.

The pixel electrode PE is disposed on the second planarization layer 118.

The pixel electrode PE is an electrode for electrically connecting the plurality of light emitting elements LEDs and the connection electrode 150. Referring to FIGS. 2 to 4, the pixel electrode PE is electrically connected to the pixel circuit and extends to the first light emitting element 130 and the second light emitting element 140. That is, the pixel electrode PE may extend from the first light emitting element 130 and be connected to the second light emitting element 140, and may be electrically connected to the connection electrode 150 and the second transistor T2 through a contact hole formed in the second planarization layer 118.

The pixel electrode PE may be formed of a conductive material, for example, a transparent conductive material such as indium tin oxide (ITO) and indium zinc oxide (IZO), but is not limited thereto.

Referring to FIG. 4, the second light emitting element 140 is disposed on the third passivation layer 117. The second light emitting element 140 is disposed in one sub-pixel SP, together with the first light emitting element 130 and a driving circuit. The second light emitting element 140 is disposed in a direction opposite to the first light emitting element 130 with respect to the pixel circuit in the sub-pixel SP.

The second light emitting element 140 includes a first semiconductor layer 141, a light emitting layer 142, a second semiconductor layer 143, the first electrode 144, a second electrode 145, and an encapsulation layer 146. The first semiconductor layer 141, the light emitting layer 142, the second semiconductor layer 143, the second electrode 145, and the encapsulation layer 146 of the second light emitting element 140 may be similar to the first semiconductor layer 131, the light emitting layer 132, the second semiconductor layer 133, the second electrode 135, and the encapsulation layer 136 of the first light emitting element 130. Accordingly, redundant descriptions will be omitted.

The second light emitting element 140 may be electrically connected to the first light emitting element 130 and the pixel electrode PE extending from the pixel circuit through a contact hole formed in the second planarization layer 118. Accordingly, in one sub-pixel SP, the first light emitting element 130 and the second light emitting element 140 may be electrically connected to the second transistor T2.

Meanwhile, when a display device is manufactured by self-aligning light emitting elements inside openings using assembly electrodes, a color mixing defect in which light emitting elements emitting light of different colors are disposed in a single sub-pixel may occur. In this case, the light emitting elements emitting light of different colors may have different sizes because materials constituting the light emitting elements and efficiencies of the materials are different from each other. For example, in the case of a light emitting element having a relatively low light emitting efficiency, it may be formed in a larger size than other light emitting elements so that it may emit light with the same luminance as the light emitting elements that emits light of different colors. Therefore, when luminous efficiency of a red light emitting element is lowest, the red light emitting element may be formed in a relatively large size, and when luminous efficiency of a blue light emitting element is highest among the light emitting elements, the blue light emitting element may be formed in a relatively small size.

Accordingly, sizes of openings in which the light emitting elements are disposed on the substrate may be disposed to correspond to the sizes of the light emitting elements so that the elements emitting light of the same color may be self-aligned in the same sub-pixel. However, when a self-alignment process is performed in the above-described manner, the light emitting elements having a relatively small size may be disposed in openings where light emitting elements having a relatively large size are disposed, that is, may be disposed in sub-pixels emitting light of different colors. For example, a green light emitting element or a blue light emitting element smaller in size than a red light emitting element may be disposed in a sub-pixel in which the red light emitting element is disposed, and a blue light emitting element smaller in size than the green light emitting element may be disposed in a sub-pixel in which the green light emitting element is disposed. Therefore, there is a problem in which light emitting elements emitting light of different colors are disposed in one sub-pixel or light emitting elements emitting light of unintended colors are disposed in one sub-pixel to cause color mixing defects.

Accordingly, when a color mixing defect occurs in a sub-pixel, a pixel electrode of a light emitting element causing the color mixing defect may be disconnected to thereby darken the light emitting element which is misplaced. However, in a case in which a display device is configured in such a manner that the pixel electrode extends in one direction from a pixel circuit and is connected to a first light emitting element and a second light emitting element, when a defect occurs in the light emitting element disposed far from the pixel circuit, the defective light emitting element may be darkened by disconnecting the pixel electrode between the elements. Meanwhile, when a light emitting element disposed far from the pixel circuit is a normal light emitting element, and the other light emitting element disposed between the pixel circuit and the normal light emitting element is misplaced, the pixel electrode between the pixel circuit and the light emitting element is disconnected, so that the normal light emitting element disposed far from the pixel circuit is also disconnected from the pixel circuit. As a result, all of a plurality of the light emitting element disposed in the sub-pixel may be darkened, and thus, a darkened area may be visually recognized by a user.

Therefore, in the display device 100 according to an exemplary aspect of the present disclosure, a pair of light emitting elements LED disposed in each of the plurality of sub-pixels SP are disposed to be spaced apart with the pixel circuit interposed therebetween, so that only one light emitting element LED may be connected to the pixel electrode PE extending from the pixel circuit. For example, referring to FIG. 2, the first light emitting element 130 is disposed on the upper side of the pixel circuit and the second light emitting element 140 is disposed on the lower side of the pixel circuit. In the case of configuring the display device 100 as described above, if one of the first light emitting element 130 and the second light emitting element 140 is misplaced, the other one may maintain connection with the pixel circuit. Therefore, in the display device 100 according to an exemplary aspect of the present disclosure, a level of a darkened area perceived by the eyes may be improved by selectively darkening only the misplaced light emitting element.

Meanwhile, when one light emitting element is misplaced in the display device 100 described in FIGS. 1 to 4, a repair process will be initiated and explained with reference to FIG. 5.

Figure 5:
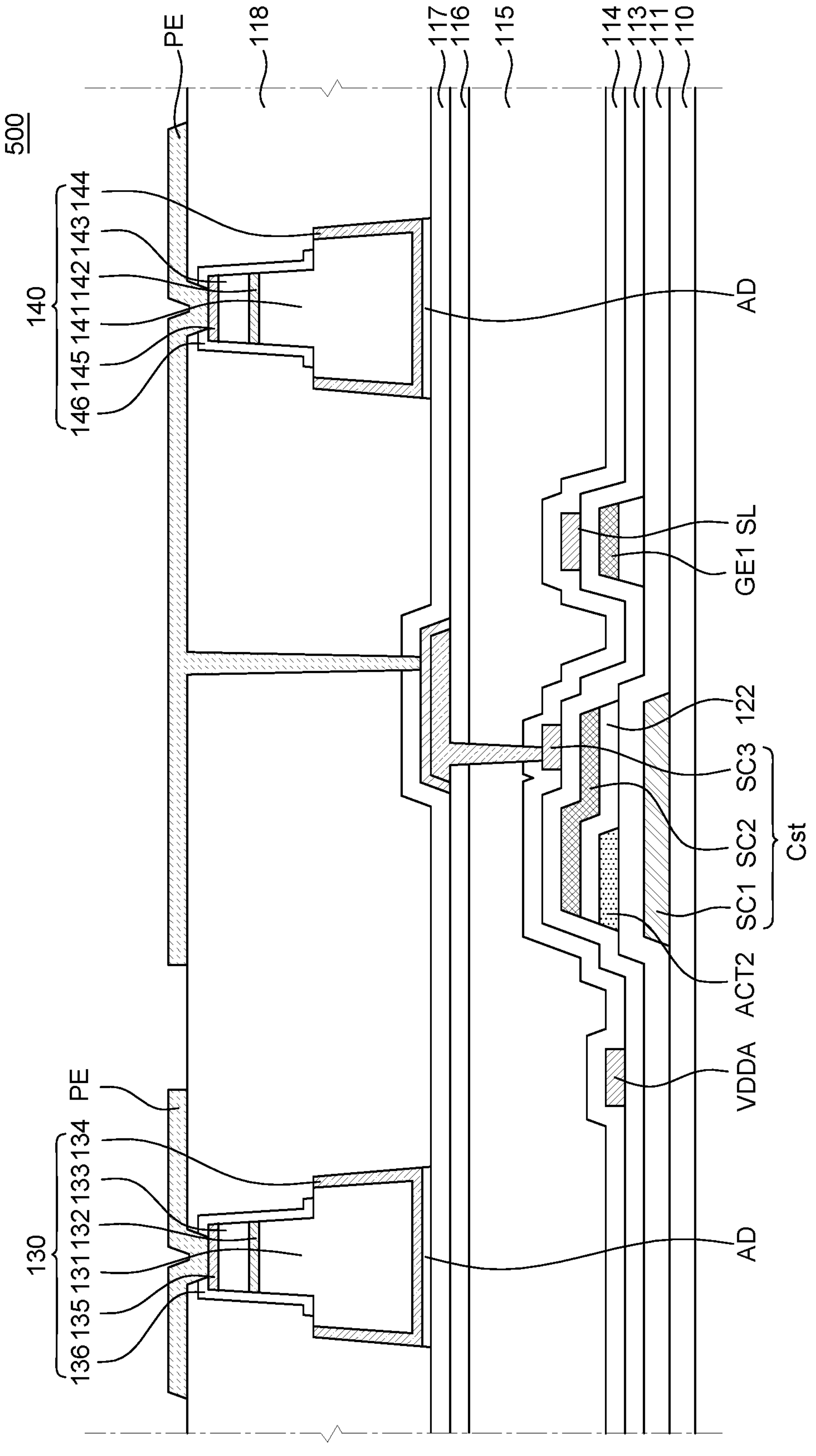
FIG. 5 is a cross-sectional view of a display device according to another exemplary aspect of the present disclosure.

FIG. 5 is a cross-sectional view of a display device according to another exemplary aspect of the present disclosure. Specifically, in FIG. 5, it is assumed that the first light emitting element 130 among the first light emitting element 130 and the second light emitting element 140 is misplaced. Other configurations of a display device 500 illustrated in FIG. 5 are similar to those of the display device 100 illustrated in FIGS. 1 to 4 except for a difference in the pixel electrode PE, so redundant descriptions will be omitted.

Referring to FIG. 5, the sub-pixel SP includes the first light emitting element 130 and the second light emitting element 140. Here, when the sub-pixel SP illustrated in FIG. 5 is a red sub-pixel, the second light emitting element 140 is a red light emitting element, but the first light emitting element 130 may be a blue light emitting element or a green light emitting element that emits light of a different color from that of the second light emitting element 140. Accordingly, the first light emitting element 130 and the second light emitting element 140 are light emitting elements LED that emit light of different colors, and the size of the first light emitting element 130 may differ from that of the second light emitting element 140.

As described above, when the first light emitting element 130 is misplaced in the sub-pixel SP, electrical connection between the first light emitting element 130 and the pixel circuit should be disconnected. Accordingly, in the display device 500 according to another exemplary aspect of the present disclosure, a cutting process for disconnecting the pixel electrode PE connecting the first light emitting element 130 and the pixel circuit may be performed.

For example, the pixel electrode PE may be disconnected by a laser irradiation method. Referring to FIG. 5, the pixel electrode PE is separated between the pixel circuit, the first light emitting element 130 and the second light emitting element 140. Accordingly, the pixel electrode PE is connected to the light emitting element LED that is normally disposed among the first light emitting element 130 and the second light emitting element 140, that is, is connected to the second light emitting element 140. Accordingly, the second light emitting element 140, which is a normal light emitting element LED, may emit light by the pixel circuit, and the first light emitting element 130, which is a light emitting element LED that causes a color mixing defect, is not connected to the pixel circuit and may not emit light.

Meanwhile, in FIG. 5, descriptions are made on the assumption that the first light emitting element 130 disposed on an upper portion of the sub-pixel SP is a light emitting element that causes a color mixing defect, but the present disclosure is not limited thereto. When the second light emitting element 140 disposed on a lower portion of the sub-pixel SP is a light emitting element LED causing a color mixing defect, the pixel electrode PE between the pixel circuit and the second light emitting element 140 is separated, so that the light emitting element LED causing the color mixing defect may be darkened.

In addition, in FIG. 5, descriptions are made on the assumption that a color mixing defect occurs in the sub-pixel SP, but the present disclosure is not limited thereto. When the light emitting element LED itself has a defect or even when electrical connection between the pixel circuit and the light emitting element LED is defective, a disconnection process may be performed on the pixel electrode PE in the sub-pixel SP to darken the defective light emitting element LED.

In the display device 100 according to another exemplary aspect of the present disclosure, a pair of light emitting elements LED disposed in each of the plurality of sub-pixels SP are spaced apart from each other with a pixel circuit interposed therebetween. In this case, electrical connection between a misplaced or defective light emitting element LED and the pixel circuit is disconnected so that only a normal light emitting element LED is connected to the pixel circuit PE, and the misplaced or defective light emitting element LED may no longer emit light by the pixel circuit PE.

Figure 6:
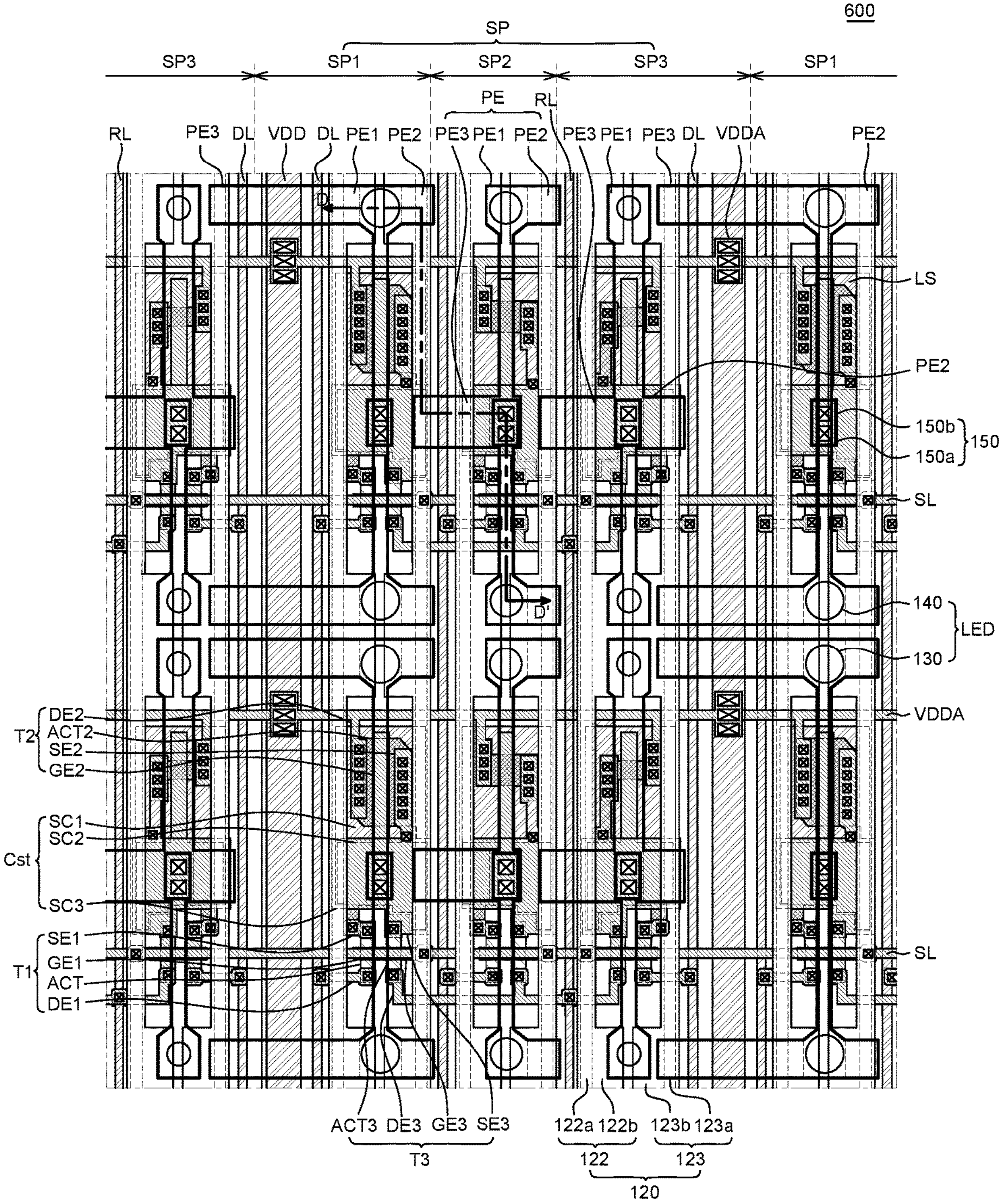
FIG. 6 is an enlarged plan view of a display device according to still another exemplary aspect of the present disclosure.
Figure 7:
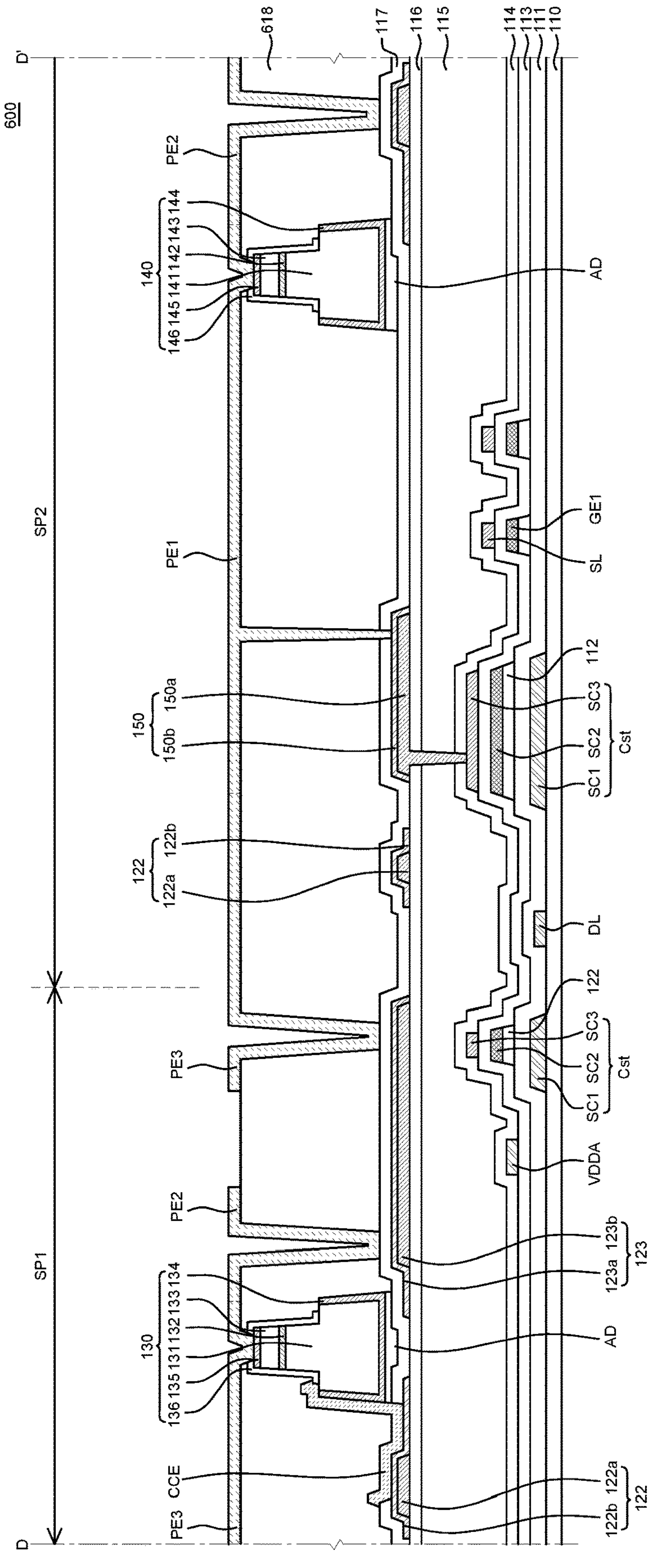
FIG. 7 is a cross-sectional view taken along line D-D' of FIG. 6.

FIG. 6 is an enlarged plan view of a display device according to still another exemplary aspect of the present disclosure. FIG. 7 is a cross-sectional view line D-D' of FIG. 6. Other configurations of a display device 600 of FIGS. 6 and 7 are similar to those of the display device 100 of FIGS. 1 to 4 except for differences only in shapes of the pixel electrode PE and a second planarization layer 618, so redundant descriptions will be omitted.

Referring to FIG. 6, the pixel electrode PE includes a first portion PE1 extending to the first light emitting element 130 and the second light emitting element 140, a second portion PE2 disposed to overlap with the second assembly electrode 123 of the sub-pixel SP in which the pixel electrode PE is disposed, and a third portion PE3 extending from the first portion PE1 and disposed to overlap with the second assembly electrode 123 of the sub-pixel SP disposed in a column adjacent to the sub-pixel SP in which the pixel electrode PE is disposed. Accordingly, the pixel electrodes PE of the plurality of sub-pixels SP overlap with the second assembly electrodes 123 of the corresponding sub-pixels SP and the second assembly electrodes 123 of the sub-pixels SP disposed in columns adjacent thereto. For example, the pixel electrode PE of the first sub-pixel SP1 may overlap with the second assembly electrodes 123 of each of the first and third sub-pixels SP1 and SP3, the pixel electrode PE of the second sub-pixel SP2 may overlap with the second assembly electrodes 123 of each of the second sub-pixel SP2 and the first sub-pixel SP1, and the pixel electrode PE of the third sub-pixel SP3 may overlap with the second assembly electrodes 123 of each of the third sub-pixel SP3 and the second sub-pixel SP2.

First, the second portion PE2 and the third portion PE3 of the first sub-pixel SP1 are disposed on the same line. For example, the second portion PE2 of the first sub-pixel SP1 and the third portion PE3 of the first sub-pixel SP1 may extend in a row direction from upper portions of the first light emitting element 130 and the second light emitting element 140.

Next, the second portion PE2 and the third portion PE3 of the second sub-pixel SP2 extend from different positions of the first portion PE1. For example, the second portion PE2 of the second sub-pixel SP2 extends in a row direction from the upper portions of the first light emitting element 130 and the second light emitting element 140 of the second sub pixel SP2, and the third portion PE3 of the second sub-pixel SP2 may extend in the row direction from an upper portion of the pixel circuit of the second sub-pixel SP2.

Next, the second portion PE2 and the third portion PE3 of the third sub-pixel SP3 are disposed on the same line. For example, the second portion PE2 of the third sub-pixel SP3 and the third portion PE3 of the third sub-pixel SP3 extend in the row direction from an upper portion of the pixel circuit of the third sub-pixel SP3.

Next, referring to FIG. 7, a groove may be disposed in the second planarization layer 618 in an area corresponding to a portion of the pixel electrode PE of the sub-pixel SP. The groove of the second planarization layer 618 is an area from which the second planarization layer 618 is removed, and may expose an upper surface of the third passivation layer 117 disposed below the second planarization layer 618. The groove of the second planarization layer 618 may be disposed in areas corresponding to the second portion PE2 and the third portion PE3 of the pixel electrode PE of the sub-pixel SP. Accordingly, the second portion PE2 and the third portion PE3 of the pixel electrode PE are disposed along the grooves disposed in the second planarization layer 618. Meanwhile, the second portion PE2 and the third portion PE3 of the pixel electrode PE may contact an upper surface of the third passivation layer 117 disposed on the second assembly electrode 123 in the areas where the grooves of the second planarization layer 618 are disposed. Accordingly, the second portion PE2 and the third portion PE3 of the pixel electrode PE may be insulated from the second assembly electrode 123.

For example, referring to FIG. 7, the groove of the second planarization layer 618 is disposed in an area where the second portion PE2 of the first sub-pixel SP1 and the second assembly electrode 123 of the first sub-pixel SP1 overlap with, and the second portion PE2 of the pixel electrode PE of the first sub-pixel SP1 may contact the upper surface of the third passivation layer 117, which is disposed on the second assembly electrode 123 of the first sub-pixel SP1.

Next, the groove of the second planarization layer 618 is disposed in an area where the third portion PE3 of the second sub-pixel SP2 and the second assembly electrode 123 of the first sub-pixel SP1 overlap with, and the third portion PE3 of the pixel electrode PE of the second sub-pixel SP2 may contact the upper surface of the third passivation layer 117, which is disposed on the second assembly electrode 123 of the first sub-pixel SP1.

Meanwhile, although FIG. 7 illustrates a case where the groove of the second planarization layer 618 is disposed in an area overlapping with the second assembly electrode 123 of the first sub-pixel SP1, the groove of the second planarization layer 618 may be disposed in areas overlapping with the second assembly electrode 123 of the second sub-pixel SP2 and the second assembly electrode 123 of the third sub-pixel SP3. Accordingly, the grooves of the second planarization layer 618 may be disposed in areas where the second assembly electrode 123 of the second sub-pixel SP2, and the second portion PE2 of the pixel electrode PE of the second sub-pixel SP2 and the third portion PE3 of the pixel electrode PE of the third sub-pixel SP3 overlap with. In addition, the grooves of the second planarization layer 618 may be disposed in areas where the second assembly electrode 123 of the third sub-pixel SP3, and the second portion PE2 of the pixel electrode PE of the third sub-pixel SP3 and the third portion PE3 of the pixel electrode PE of the first sub-pixel SP1 overlap with.

In the display device 600 according to another exemplary aspect of the present disclosure, the pixel electrode PE of the sub-pixel SP is disposed to overlap with the sub-pixel SP disposed in a column adjacent thereto. Specifically, the pixel electrode PE of one sub-pixel SP is disposed to overlap with the second assembly electrode 123 of another sub-pixel SP disposed in a column adjacent thereto. Accordingly, in the sub-pixel SP of the display device, when the light emitting element LED causing a color mixing defect, which emits light of the same color as that of the light emitting element LED disposed in an adjacent column, is disposed, repair may be performed by connecting the light emitting element LED causing the color mixing defect to the pixel circuit of the sub-pixel SP disposed in the adjacent column.

Hereinafter, FIGS. 8 and 9 will be referred together to describe a case in which the light emitting element LED of the first sub-pixel SP1 is repaired when a color mixing defect occurs in the first sub-pixel SP1.

Figure 8:
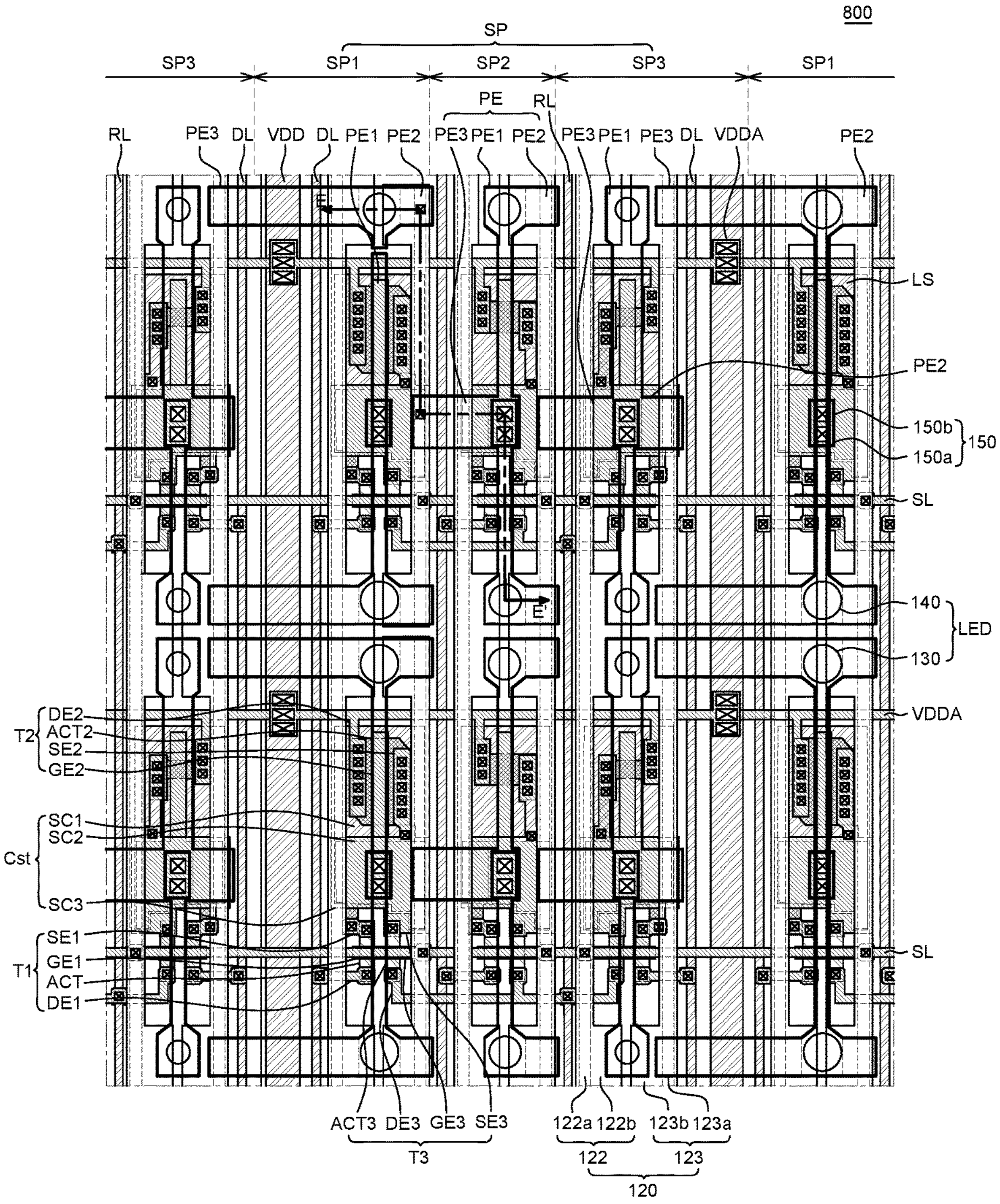
FIG. 8 is an enlarged plan view of a display device according to still another exemplary aspect of the present disclosure.

FIG. 8 is an enlarged plan view of a display device according to still another exemplary aspect of the present disclosure. FIG. 9 is a cross-sectional view taken along line E-E' of FIG. 8. FIGS. 8 and 9 are cross-sectional views after performing a repair process in a case where a light emitting element LED emitting light of the same color as that of a light emitting element LED to be disposed in the second sub-pixel SP2 is disposed in the first sub-pixel SP1. Other configurations of a display device 800 of FIGS. 8 and 9 are similar to those of the display device 600 of FIGS. 6 and 7 except for differences only in shapes of the light emitting element LED, the pixel electrode PE, and a third passivation layer 817, so redundant descriptions will be omitted.

The first sub-pixel SP1 includes the first light emitting element 130 and the second light emitting element 140 spaced apart from each other with a pixel circuit interposed therebetween.

The first light emitting element 130 of the first sub-pixel SP1 and the second light emitting element 140 of the first sub-pixel SP1 may emit light of different colors. For example, when the first sub-pixel SP1 disposed in the first column is a red sub-pixel, the second light emitting element 140 of the first sub-pixel SP1 may be a red light emitting element, but the first light emitting element 130 of the first sub-pixel SP1 may be a green light emitting element that emits light of a different color from the second light emitting element 140 of the first sub-pixel SP1. In this case, the first light emitting element 130 of the first sub-pixel SP1 may be the same as the first light emitting element 130 and the second light emitting element 140 of the second sub-pixel SP2. In this case, since the first light emitting element 130 and the second light emitting element 140 are different types of light emitting elements LED, the size of the first light emitting element 130 may differ from that of the second light emitting element 140.

In the display device 800 according to still another exemplary aspect of the present disclosure, a cutting process may be performed to disconnect the pixel electrode PE and the first light emitting element 130 of the first sub-pixel SP1 so that the first light emitting element 130 of the first sub-pixel SP1 emitting green light no longer emits light by the pixel circuit that drives a red light emitting element of the first sub-pixel SP1.

Accordingly, the pixel electrode PE of the first sub-pixel SP1 may be separately disposed. For example, the first portion PE1 of the pixel electrode PE of the first sub-pixel SP1 is separated between the first light emitting element 130, and the pixel circuit and the second light emitting element 140, and is electrically connected only to the second light emitting element 140 among the first light emitting element 130 and the second light emitting element 140 of the first sub-pixel SP1. Referring to FIG. 8, the second light emitting element 140 of the first sub-pixel SP1 is connected to the pixel circuit by the first portion PE1 of the pixel electrode PE, and the first light emitting element 130 of the first sub-pixel SP1 is electrically insulated from the second light emitting element 140 and the pixel circuit of the first sub-pixel SP1.

Accordingly, the second light emitting element 140 of the first sub-pixel SP1 may emit light by the pixel circuit of the first sub-pixel SP1, and a signal applied from the pixel circuit of the first sub-pixel SP1 may not be transmitted to the first light emitting element 130 of the first sub-pixel SP1.

The first light emitting element 130 of the first sub-pixel SP1 may be connected to the pixel circuit of the second sub-pixel SP2 in which a light emitting element emitting light of the same color as that of the first light emitting element 130 of the first sub-pixel SP1 is disposed. Referring to FIGS. 8 and 9, the second assembly electrode 123 of the first sub-pixel SP1 is connected to the second portion PE2 of the first sub-pixel SP1, and is electrically connected to the third portion PE3 of the pixel electrode PE of the second sub-pixel SP2.

First, if a welding process is performed by irradiating a laser on an area where the second assembly electrode 123 of the first sub-pixel SP1 and the second portion PE2 of the pixel electrode PE overlap with, the third passivation layer 817 is opened in the area where the laser is irradiated, and the second portion PE2 of the pixel electrode PE of the first sub-pixel SP1 may be electrically connected to the second assembly electrode 123 of the first sub-pixel SP1. Next, a welding process is performed by irradiating a laser on an area where the second assembly electrode 123 of the first sub-pixel SP1 and the third portion PE3 of the pixel electrode PE of the second sub-pixel SP2 overlap with, the third passivation layer 817 is opened between the second assembly electrode 123 of the first sub-pixel SP1 and the third portion PE3 of the pixel electrode PE of the second sub-pixel SP2. The third portion PE3 of the pixel electrode PE of the second sub-pixel SP2 may be electrically connected to the second assembly electrode 123 of the first sub-pixel SP1. Accordingly, the first light emitting element 130 of the first sub-pixel SP1 may be driven by the pixel circuit of the second sub-pixel SP2.

Meanwhile, referring to FIG. 8, the second assembly electrode 123 of the first sub-pixel SP1 is separated from the second assembly electrode 123 of another first sub-pixel SP1 adjacent thereto in the row direction, so that electrical connection of a driving circuit of the second sub-pixel SP2 to another sub-pixel SP adjacent to the first sub-pixel SP1 in the row direction may be blocked. For example, the second assembly electrode 123 of the first sub-pixel SP1 may be disconnected by irradiating a laser from the outside of the first light emitting element 130 and the second light emitting element 140 of the first sub-pixel SP1.

Accordingly, when color mixing defects occur in other sub-pixels SP adjacent to the first sub-pixel SP1 in the row direction, additional repair may be performed by using the second assembly electrode 123 of the first sub-pixel SP1 as a repair line.

Figure 9:
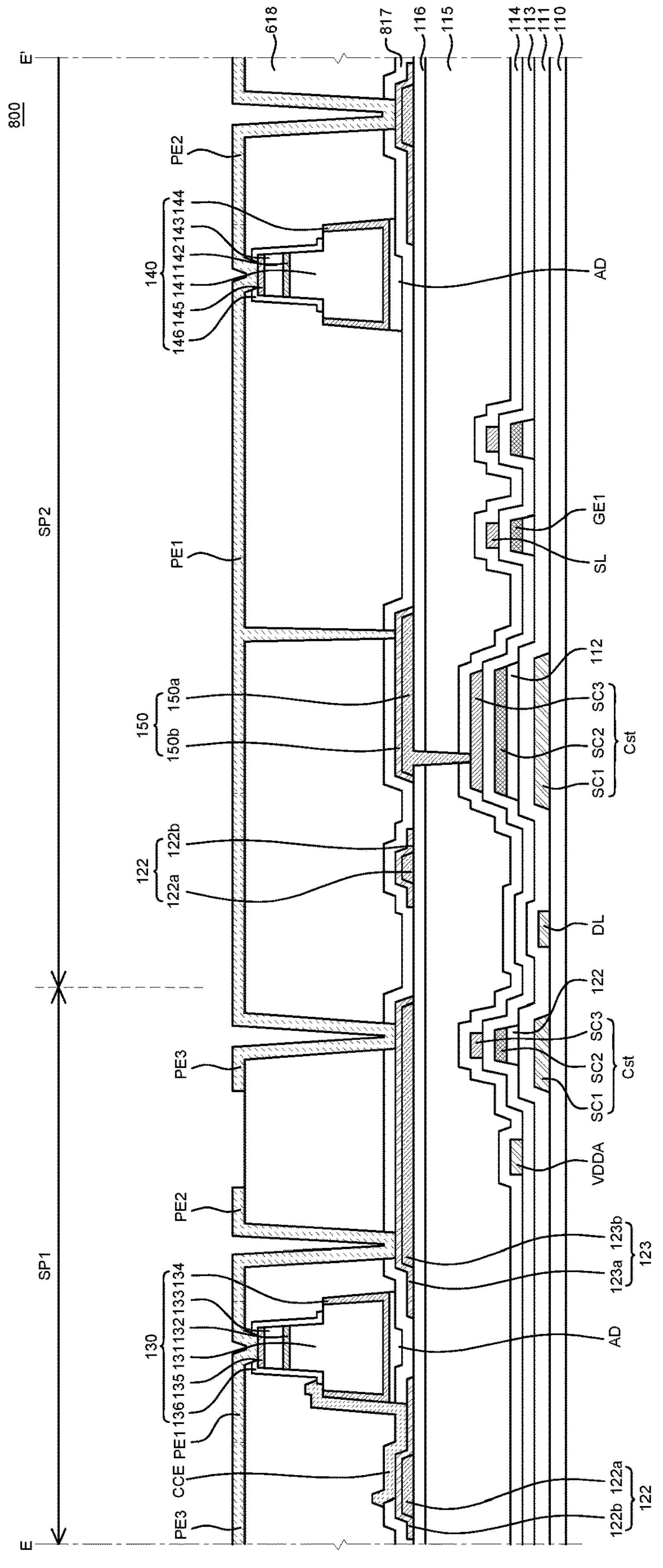
FIG. 9 is a cross-sectional view taken along line E-E' of FIG. 8.

Meanwhile, in FIGS. 8 and 9, descriptions are made on the assumption that the first light emitting element 130 of the first sub-pixel SP1 causes a color mixing defect, but the present disclosure is not limited thereto. When the second light emitting element 140 disposed in the first sub-pixel SP1 is a light emitting element LED that is identical to the light emitting element LED disposed in the second sub pixel SP2, repair may be performed by connecting the second light emitting element 140 of the first sub-pixel SP1 and the pixel circuit of the second sub-pixel SP2 in the same manner described above. In addition, when both the first light emitting element 130 and the second light emitting element 140 disposed in the first sub-pixel SP1 are light emitting elements LED that are identical to the light emitting element LED disposed in the second sub pixel SP2, repair may be performed by connecting both the first light emitting element 130 and the second light emitting element 140 to the pixel circuit of the second sub-pixel SP2.

In the display device 800 according to still another exemplary aspect of the present disclosure, the pixel electrode PE of the sub-pixel SP is disposed to overlap with the sub-pixel SP disposed in a column adjacent thereto. Accordingly, when an element causing a color mixing defect is disposed in the first sub-pixel SP1, that is, when a light emitting element LED emitting light of the same color as that of the second sub-pixel SP2 is disposed in the first sub-pixel SP1, it is possible to easily repair the sub-pixel SP where the color mixing defect occurs by using the second assembly electrode 123 among the assembly electrodes 120. For example, when a green light emitting element emitting green light is disposed in the first sub-pixel SP1 emitting red light, repair may be performed by connecting the green light emitting element of the first sub-pixel SP1 and the pixel circuit of the second sub-pixel pixel SP2 where a light emitting element emitting green light is disposed.

In addition, in the display device 800 according to still another exemplary aspect of the present disclosure, the light emitting element LED of the sub-pixel SP where a color mixing defect occurs is connected to the pixel circuit of the sub-pixel SP adjacent thereto by using the second assembly electrode 123 without further disposing a separate structure, so that a structure of the display device 800 may be simplified, and materials of components may be simplified/or unified.

Figure 10:
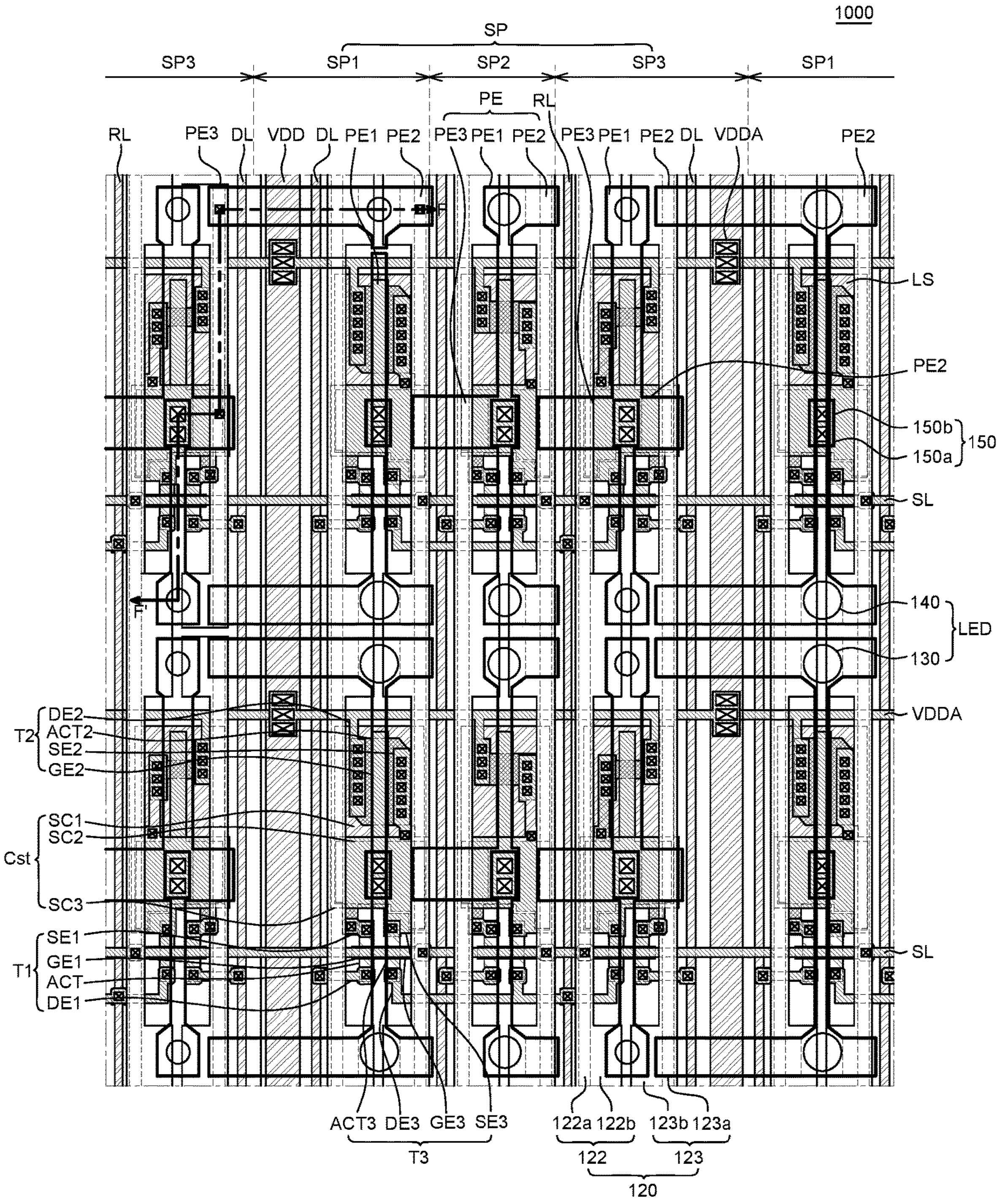
FIG. 10 is an enlarged plan view of a display device according to still another exemplary aspect of the present disclosure.
Figure 11:
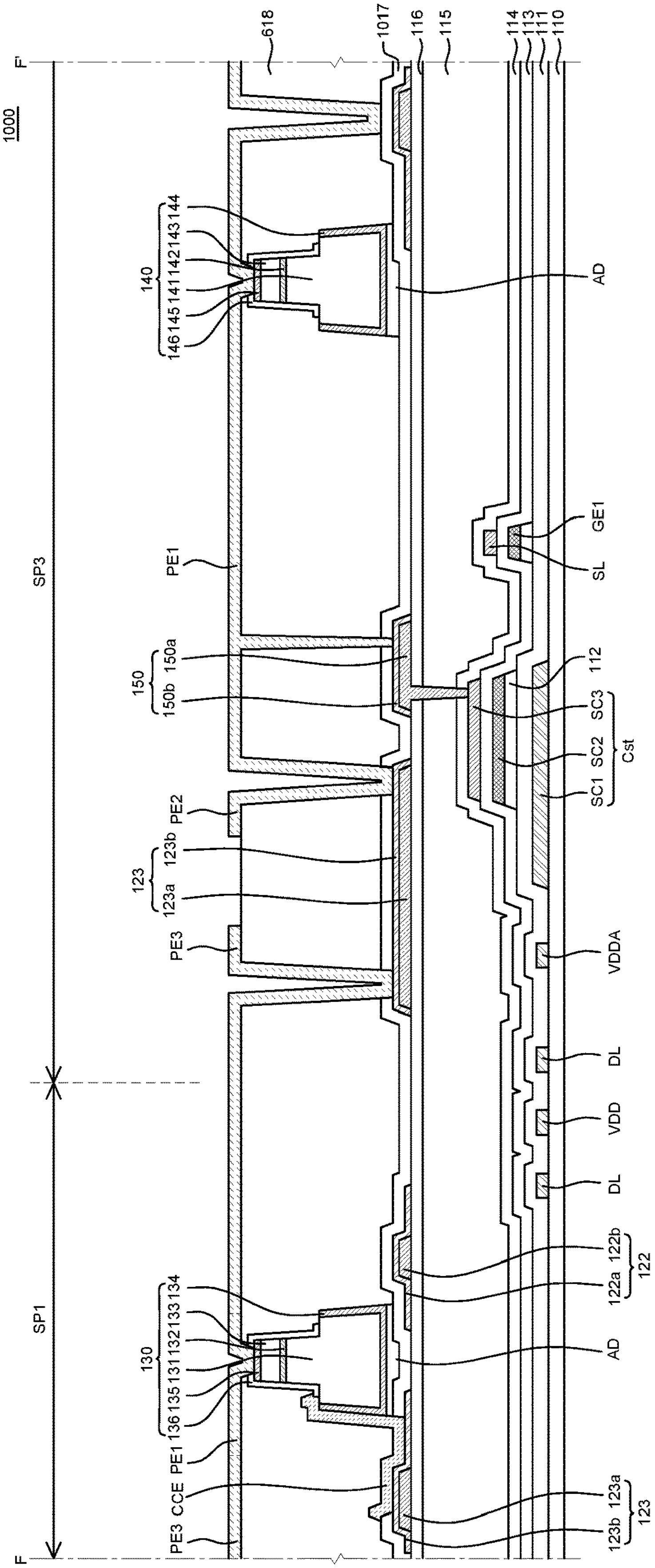
FIG. 11 is a cross-sectional view taken along line F-F' of FIG. 10.

FIG. 10 is an enlarged plan view of a display device according to still another exemplary aspect of the present disclosure. FIG. 11 is a cross-sectional view taken along line F-F' of FIG. 10. FIGS. 10 and 11 are cross-sectional views after performing a repair process in a case where a light emitting element LED emitting light of the same color as that of a light emitting element LED to be disposed in the third sub-pixel SP3 is disposed in the first sub-pixel SP1. Other configurations of a display device 1000 of FIGS. 10 and 11 are similar to those of the display device 600 of FIGS. 6 and 7 except for differences only in shapes of the light emitting element LED, the pixel electrode PE, and a third passivation layer 1017, so redundant descriptions will be omitted.

The first sub-pixel SP1 includes the first light emitting element 130 and the second light emitting element 140 spaced apart from each other with a pixel circuit interposed therebetween.

The first light emitting element 130 of the first sub-pixel SP1 and the second light emitting element 140 of the first sub-pixel SP1 may emit light of different colors. For example, when the first sub-pixel SP1 disposed in the first column is a red sub-pixel, the second light emitting element 140 of the first sub-pixel SP1 may be a red light emitting element, but the first light emitting element 130 of the first sub-pixel SP1 may be a blue light emitting element that emits light of a different color from the second light emitting element 140 of the first sub-pixel SP1. In this case, the first light emitting element 130 of the first sub-pixel SP1 may be the same as the first light emitting element 130 and the second light emitting element 140 of the third sub-pixel SP3.

In the display device 1000 according to still another exemplary aspect of the present disclosure, a cutting process may be performed to disconnect the pixel electrode PE and the first light emitting element 130 of the first sub-pixel SP1 so that the first light emitting element 130 of the first sub-pixel SP1 emitting blue light no longer emits light by the pixel circuit that drives the red light emitting element of the first sub-pixel SP1.

For example, the pixel electrode PE may be disconnected by a laser irradiation method. For example, the first portion PE1 of the pixel electrode PE of the first sub-pixel SP1 is separated between the first light emitting element 130, and the pixel circuit and the second light emitting element 140, and is electrically connected only to the second light emitting element 140 among the first light emitting element 130 and the second light emitting element 140 of the first sub-pixel SP1. Referring to FIG. 10, the second light emitting element 140 of the first sub-pixel SP1 is connected to the pixel circuit by the first portion PE1 of the pixel electrode PE, and the first light emitting element 130 of the first sub-pixel SP1 is electrically insulated from the second light emitting element 140 and the pixel circuit of the first sub-pixel SP1. Accordingly, the second light emitting element 140 of the first sub-pixel SP1 may emit light by the pixel circuit of the first sub-pixel SP1, and the signal applied from the pixel circuit of the first sub-pixel SP1 may not be transmitted to the first light emitting element 130 of the first sub-pixel SP1.

The first light emitting element 130 of the first sub-pixel SP1 may be connected to the pixel circuit of the third sub-pixel SP3 in which a light emitting element emitting light of the same color as that of the first light emitting element 130 of the first sub-pixel SP1 is disposed. Referring to FIGS. 10 and 11, the second assembly electrode 123 of the third sub-pixel SP3 is connected to the second portion PE2 of the third sub-pixel SP3, and is electrically connected to the third portion PE3 of the first sub-pixel SP1.

First, if a welding process is performed by irradiating a laser on an area where the second assembly electrode 123 of the third sub-pixel SP3 and the second portion PE2 of the pixel electrode PE overlap with each other, the third passivation layer 1017 is opened in the area where the laser is irradiated, and the pixel circuit of the third sub-pixel SP3 may be electrically connected to the second assembly electrode 123 of the third sub-pixel SP3. Next, if a welding process is performed by irradiating a laser on an area where the second assembly electrode 123 of the third sub-pixel SP3 and the second portion PE2 of the pixel electrode PE of the first sub-pixel SP1 overlap with each other, the third passivation layer 1017 is opened in the area where the laser is irradiated, and the pixel circuit of the third sub-pixel SP3 may be electrically connected to the second portion PE2 of the pixel electrode PE. Accordingly, the first light emitting element 130 of the first sub-pixel SP1 may be driven by the pixel circuit of the third sub-pixel SP3.

Meanwhile, referring to FIG. 10, the second assembly electrode 123 of the third sub-pixel SP3 is separated from the second assembly electrode 123 of another third sub-pixel SP3 adjacent thereto in the row direction, so that electrical connection of a driving circuit of the first sub-pixel SP1 to another sub-pixel SP adjacent to the third sub-pixel SP3 in the row direction may be blocked. Accordingly, when color mixing defects occur in other sub-pixels SP adjacent to the first sub-pixel SP1 in the row direction, additional repair may be performed by using the second assembly electrode 123 of the third sub-pixel SP3 as a repair line.

Meanwhile, in FIGS. 10 and 11, descriptions are made on the assumption that the first light emitting element 130 of the first sub-pixel SP1 causes a color mixing defect, but the present disclosure is not limited thereto. When the second light emitting element 140 or both the first light emitting element 130 and the second light emitting element 140 disposed in the first sub-pixel SP1 are light emitting elements LED that are identical to the light emitting element LED disposed in the third sub-pixel SP3, repair may be performed by connecting the light emitting element LED causing a color mixing defect to the pixel circuit of the third sub-pixel SP3.

In the display device 1000 according to still another exemplary aspect of the present disclosure, the pixel electrode PE of the sub-pixel SP is disposed to overlap with the sub-pixel SP disposed in a column adjacent thereto. Accordingly, when an element causing a color mixing defect is disposed in the first sub-pixel SP1, that is, when a light emitting element LED emitting light of the same color as that of the third sub-pixel SP3 is disposed in the first sub-pixel SP1, it is possible to easily repair the sub-pixel SP where the color mixing defect occurs by using the second assembly electrode 123 among the assembly electrodes 120. For example, when a blue light emitting element emitting blue light is disposed in the first sub-pixel SP1 emitting red light, repair may be performed by connecting the blue light emitting element of the first sub-pixel SP1 and the pixel circuit of the third sub-pixel SP3 where a light emitting element emitting blue light is disposed.

In addition, in the display device 1000 according to still another exemplary aspect of the present disclosure, the light emitting element LED of the sub-pixel SP where a color mixing defect occurs is connected to the pixel circuit of the sub-pixel SP adjacent thereto by using the second assembly electrode 123 without further disposing a separate structure, so that a structure of the display device 1000 may be simplified.

Figure 12:
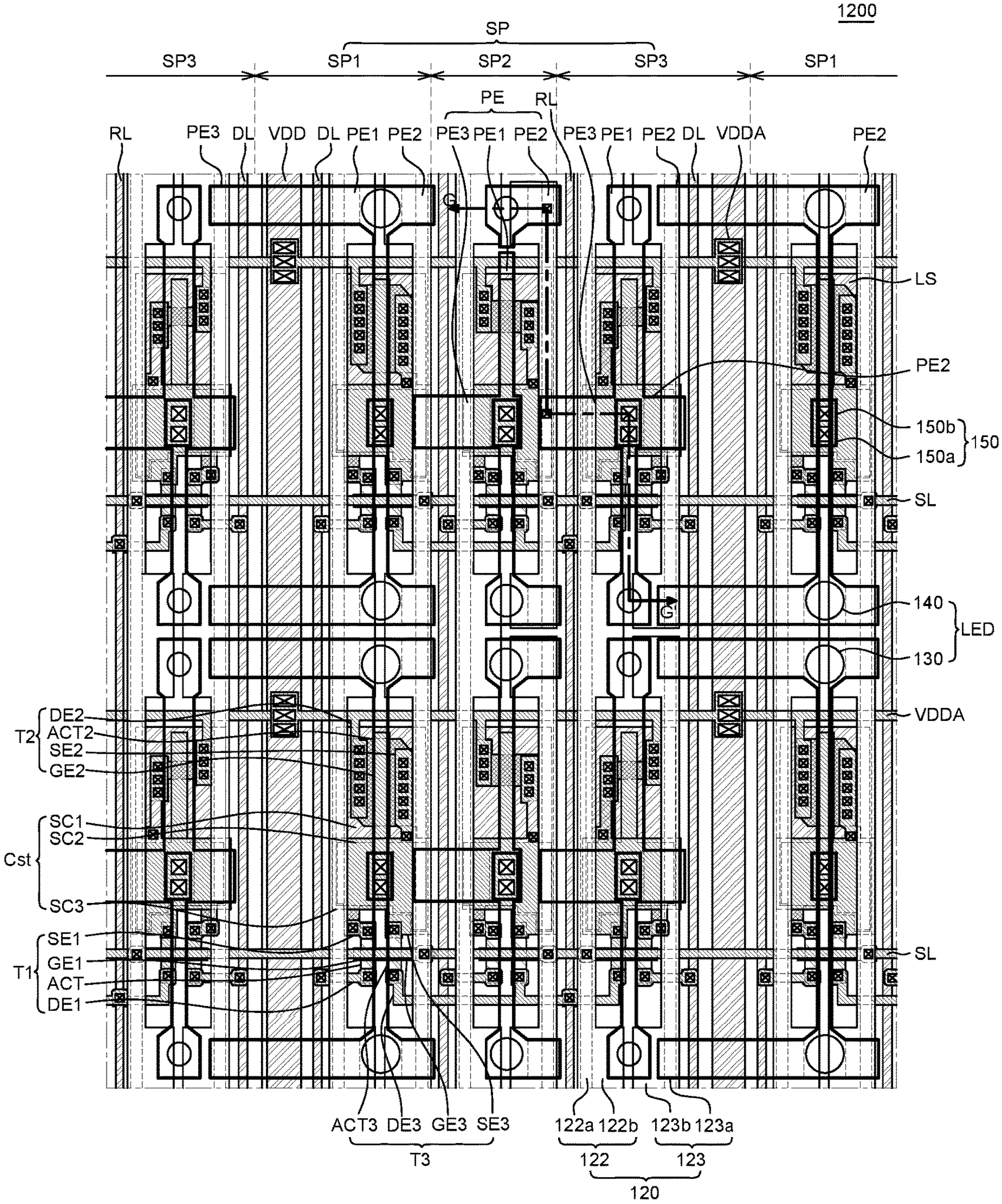
FIG. 12 is an enlarged plan view of a display device according to still another exemplary aspect of the present disclosure.
Figure 13:
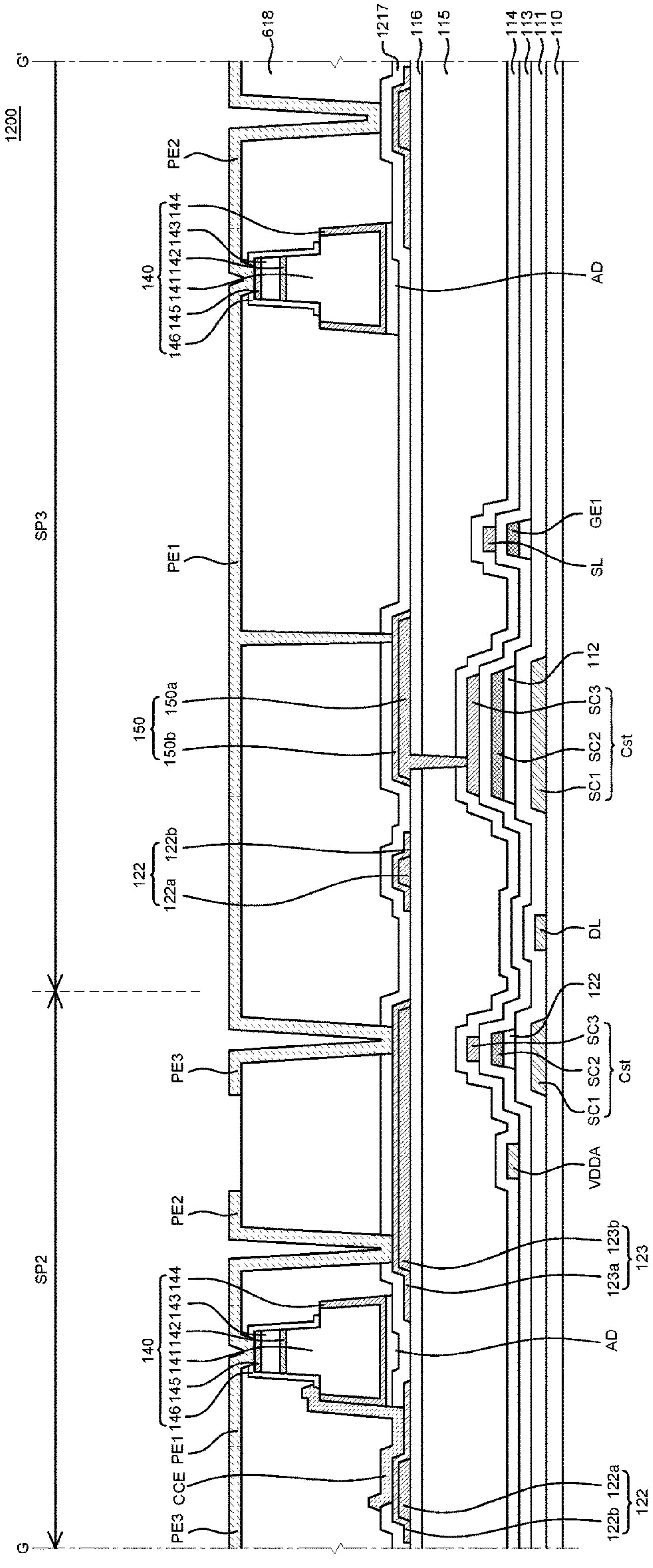
FIG. 13 is a cross-sectional view taken along line G-G' of FIG. 12.

FIG. 12 is an enlarged plan view of a display device according to still another exemplary aspect of the present disclosure. FIG. 13 is a cross-sectional view taken along line G-G' of FIG. 12. FIGS. 12 and 13 are cross-sectional views after performing a repair process in a case where a light emitting element LED emitting light of the same color as that of a light emitting element LED to be disposed in the third sub-pixel SP3 is disposed in the second sub-pixel SP2. Other configurations of a display device 1200 of FIGS. 12 and 13 are similar to those of the display device 600 of FIGS. 6 and 7 except for differences only in shapes of the light emitting element LED, the pixel electrode PE, and a third passivation layer 1217, so redundant descriptions will be omitted.

The second sub-pixel SP2 includes the first light emitting element 130 and the second light emitting element 140 spaced apart from each other with a pixel circuit interposed therebetween.

The first light emitting element 130 of the second sub-pixel SP2 and the second light emitting element 140 of the second sub-pixel SP2 may emit light of different colors. For example, when the second sub-pixel SP2 disposed in the second column is a green sub-pixel, the second light emitting element 140 of the second sub-pixel SP2 may be a green light emitting element, but the first light emitting element 130 of the second sub-pixel SP2 may be a blue light emitting element that emits light of a different color from the second light emitting element 140. In this case, the first light emitting element 130 of the second sub-pixel SP2 may be the same as the first light emitting element 130 and the second light emitting element 140 of the third sub-pixel SP3.

In the display device 1200 according to still another exemplary aspect of the present disclosure, a cutting process may be performed to disconnect the pixel electrode PE and the first light emitting element 130 of the second sub-pixel SP2 so that the first light emitting element 130 of the second sub-pixel SP2 emitting blue light no longer emits light by the pixel circuit that drives the green light emitting element of the second sub-pixel SP2.

For example, the pixel electrode PE may be disconnected by a laser irradiation method. For example, the first portion PE1 of the pixel electrode PE of the second sub-pixel SP2 is separated between the first light emitting element 130, and the pixel circuit and the second light emitting element 140, and is electrically connected only to the second light emitting element 140 among the first light emitting element 130 and the second light emitting element 140 of the second sub-pixel SP2. Referring to FIG. 12, the second light emitting element 140 of the second sub-pixel SP2 is connected to the pixel circuit by the first portion PE1 of the pixel electrode PE, and the first light emitting element 130 of the second sub-pixel SP2 is electrically insulated from the second light emitting element 140 and the pixel circuit of the second sub-pixel SP2. Accordingly, the second light emitting element 140 of the second sub-pixel SP2 may emit light by the pixel circuit of the second sub-pixel SP2, and a signal applied from the pixel circuit of the second sub-pixel SP2 may not be transmitted to the first light emitting element 130 of the second sub-pixel SP2.

The first light emitting element 130 of the second sub-pixel SP2 may be connected to the pixel circuit of the third sub-pixel SP3 in which a light emitting element emitting light of the same color as that of the first light emitting element 130 of the second sub-pixel SP2 is disposed. Referring to FIGS. 12 and 13, the second assembly electrode 123 of the second sub-pixel SP2 is connected to the second portion PE2 of the second sub-pixel SP2, and is electrically connected to the third portion PE3 of the third sub-pixel SP3.

First, if a welding process is performed by irradiating a laser on an area where the second assembly electrode 123 of the second sub-pixel SP2 and the second portion PE2 of the pixel electrode PE overlap with, the third passivation layer 1217 is opened in the area where the laser is irradiated, and the pixel circuit of the second sub-pixel SP2 may be electrically connected to the second assembly electrode 123 of the second sub-pixel SP2. Next, if a welding process is performed by irradiating a laser on an area where the second assembly electrode 123 of the second sub-pixel SP2 and the third portion PE3 of the pixel electrode PE of the third sub-pixel SP3 overlap with, the third passivation layer 1217 is opened in the area where the laser is irradiated, and the second assembly electrode 123 of the second sub-pixel SP2 and the third portion PE3 of the pixel electrode PE of the third sub-pixel SP3 may be electrically connected. Accordingly, the first light emitting element 130 of the second sub-pixel SP2 may be driven by the pixel circuit of the third sub-pixel SP3.

Meanwhile, referring to FIG. 12, the second assembly electrode 123 of the third sub-pixel SP3 is separated from the second assembly electrode 123 of another second sub-pixel SP2 adjacent thereto in the row direction, so that electrical connection of a driving circuit of the third sub-pixel SP3 to another sub-pixel SP adjacent to the second sub-pixel SP2 in the row direction may be blocked. Accordingly, when color mixing defects occur in other sub-pixels SP adjacent to the second sub-pixel SP2 in the row direction, additional repair may be performed by using the second assembly electrode 123 of the second sub-pixel SP2 as a repair line.

Meanwhile, in FIGS. 12 and 13, descriptions are made on the assumption that the first light emitting element 130 of the second sub-pixel SP2 causes a color mixing defect, but the present disclosure is not limited thereto. When the second light emitting element 140 or both the first light emitting element 130 and the second light emitting element 140 disposed in the second sub-pixel SP2 are light emitting elements LED that are identical to the light emitting element LED disposed in the third sub-pixel SP3, repair may be performed by connecting the light emitting element LED causing a color mixing defect to the pixel circuit of the third sub-pixel SP3.

In the display device 1200 according to still another exemplary aspect of the present disclosure, the pixel electrode PE of the sub-pixel SP is disposed to overlap with the sub-pixel SP disposed in a column adjacent thereto. Accordingly, when an element causing a color mixing defect is disposed in the second sub-pixel SP2, that is, when a light emitting element LED emitting light of the same color as that of the third sub-pixel SP3 is disposed in the second sub-pixel SP2, it is possible to easily repair the sub-pixel SP where the color mixing defect occurs by using the second assembly electrode 123 among the assembly electrodes 120. For example, when a blue light emitting element emitting blue light is disposed in the second sub-pixel SP2 emitting green light, repair may be performed by connecting the blue light emitting element of the second sub-pixel SP2 and the pixel circuit of the third sub-pixel SP3 where a light emitting element emitting blue light is disposed.

In addition, in the display device 1200 according to still another exemplary aspect of the present disclosure, the light emitting element LED of the sub-pixel SP where a color mixing defect occurs is connected to the pixel circuit of the sub-pixel SP adjacent thereto by using the second assembly electrode 123 without further disposing a separate structure, so that a structure of the display device 1200 may be simplified.

Hereinafter, FIGS. 14 and 15 will be referred to together to describe a case of repair the light emitting element LED of the sub-pixel SP when a defect occurs in the pixel circuit of the sub-pixel SP.

Figure 14:
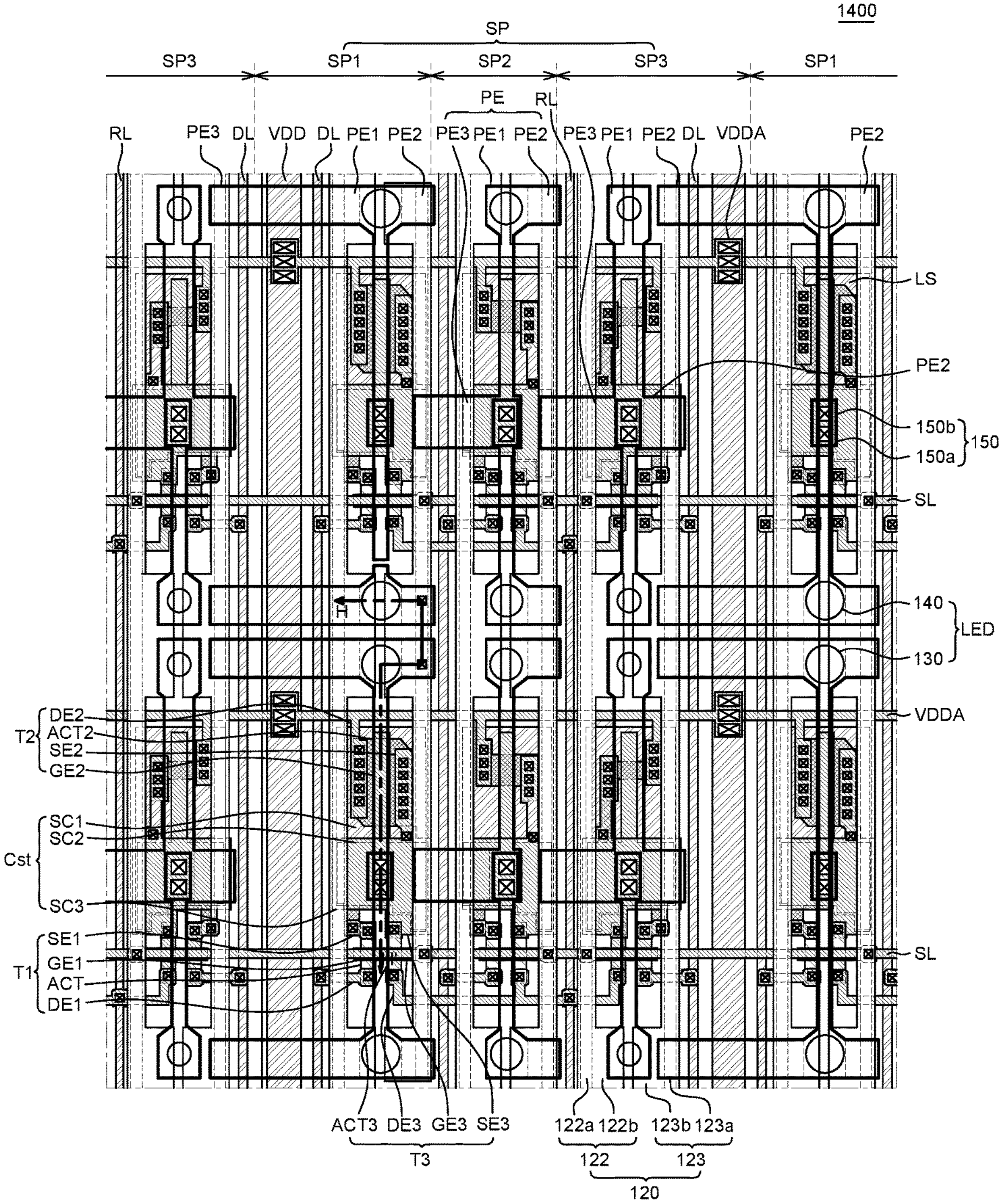
FIG. 14 is an enlarged plan view of a display device according to still another exemplary aspect of the present disclosure.

FIG. 14 is an enlarged plan view of a display device according to still another exemplary aspect of the present disclosure. FIG. 15 is a cross-sectional view line H-H' of FIG. 14. FIGS. 14 and 15 are cross-sectional views after performing a repair process in a case in which the first light emitting element 130 among the first light emitting element 130 and the second light emitting element 140 of the first sub-pixel does not emit light. Other configurations of a display device 1400 of FIGS. 14 and 15 are similar to those of the display device 600 of FIGS. 6 and 7 except for differences only in shapes of the light emitting element LED, the pixel electrode PE, and a third passivation layer 1417, so redundant descriptions will be omitted.

The first sub-pixel SP1 includes the first light emitting element 130 and the second light emitting element 140 spaced apart from each other with a pixel circuit interposed therebetween.

The first light emitting element 130 of the first sub-pixel SP1 and the second light emitting element 140 of the first sub-pixel SP1 may emit light of the same color. In this case, the first light emitting element 130 and the second light emitting element 140 disposed in the first sub-pixel SP1 may emit light of the same color as the light emitting elements LED disposed in other adjacent sub-pixels SP in the row direction.

When a pixel circuit of one sub-pixel SP among the plurality of sub-pixels SP is defective or electrical connection between the pixel circuit and the light emitting element LED is defective, at least one of the first light emitting element 130 and the second light emitting element 140 may not emit light.

In the display device 1400 according to still another exemplary aspect of the present disclosure, a cutting process may be performed to disconnect the pixel electrode PE between the light emitting element LED that does not emit light in the first sub-pixel SP1 and the pixel circuit of the first sub-pixel SP1.

For example, the pixel electrode PE may be disconnected by a laser irradiation method. The first portion PE1 of the pixel electrode PE of the first sub-pixel SP1 is separated between the first light emitting element 130, and the pixel circuit and the second light emitting element 140 and is electrically connected to only the second light emitting element 140 among the first light emitting element 130 and the second light emitting element 140 of the first sub-pixel SP1. Referring to FIG. 14, the second light emitting element 140 of the first sub-pixel SP1 is connected to the pixel circuit by the first portion PE1 of the pixel electrode PE, and the first light emitting element 130 of the first sub-pixel SP1 is electrically insulated from the second light emitting element 140 and the pixel circuit of the first sub-pixel SP1. Accordingly, the second light emitting element 140 of the first sub-pixel SP1 may emit light by the pixel circuit of the first sub-pixel SP1, and the signal applied from the pixel circuit of the first sub-pixel SP1 may not be transmitted to the first light emitting element 130 of the first sub-pixel SP1.

In addition, the first light emitting element 130 of the first sub-pixel SP1 may be connected to the pixel circuit of the sub-pixel SP which is disposed in the same column as that of the first sub-pixel SP1 and in which a light emitting element emitting light of the same color as that of the first light emitting element 130 of the first sub-pixel SP1 is disposed. Referring to FIGS. 14 and 15, the second assembly electrode 123 of the first sub-pixel SP1 is connected to the second portion PE2 of the first sub-pixel SP1 and is electrically connected to the second portion PE2 of another sub-pixel SP adjacent to the first light emitting element 130 in the column direction.

First, if a welding process is performed by irradiating a laser on an area where the second assembly electrode 123 of the first sub-pixel SP1 and the second portion PE2 of the pixel electrode PE overlap with, the third passivation layer 1417 is opened in the area where the laser is irradiated, and the first light emitting element 130 may be electrically connected to the second assembly electrode 123 of the first sub-pixel SP1. Next, if a welding process is performed by irradiating a laser on an area where the second assembly electrode 123 of the first sub-pixel SP1 and the second portion PE2 of the sub-pixel SP disposed on an upper side of the first light emitting element 130 of the first sub-pixel SP1 overlap with, the third passivation layer 1417 is opened in an area where the laser is irradiated, and the second assembly electrode 123 of the first sub-pixel SP1 and the second portion PE2 of the sub-pixel SP disposed on the upper side of the first light emitting element 130 of the first sub-pixel SP1 may be electrically connected. Accordingly, the first light emitting element 130 of the first sub-pixel SP1 may be driven by the pixel circuit of the third sub-pixel SP3 adjacent thereto in the column direction.

Meanwhile, referring to FIG. 14, the second assembly electrode 123 of the first sub-pixel SP1 is separated from the second assembly electrode 123 of another first sub-pixel SP1 adjacent thereto in the row direction, so that electrical connection of a driving circuit of the first sub-pixel SP1 to another sub-pixel SP adjacent to the first sub-pixel SP1 in the column direction may be blocked. Accordingly, when color mixing defects occur in other sub-pixels SP adjacent to the first sub-pixel SP1 in the column direction, repair may be performed by using the second assembly electrode 123 of the first sub-pixel SP1 as a repair line.

Figure 15:
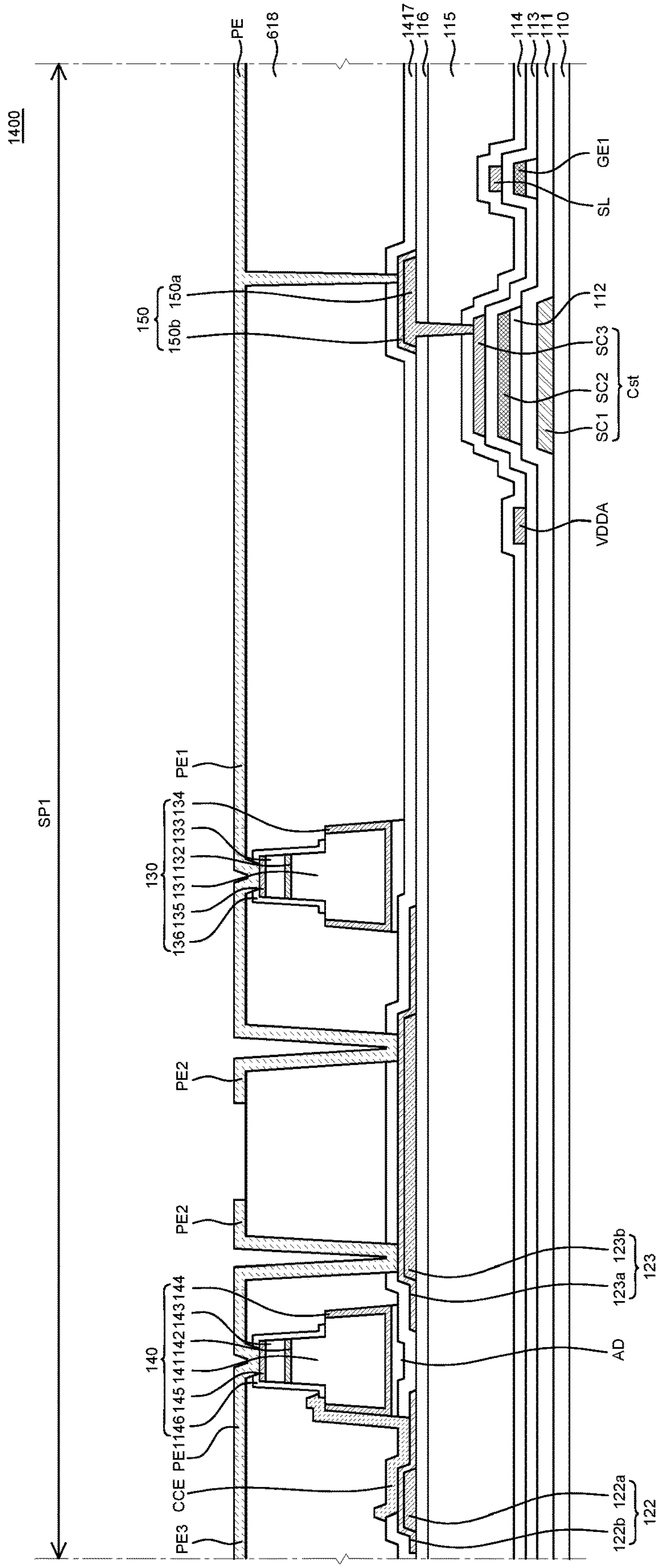
FIG. 15 is a cross-sectional view taken along line H-H' of FIG. 14.

Meanwhile, in FIGS. 14 and 15, descriptions are made on the assumption that the pixel circuit of the first sub-pixel SP1 is defective, but the present disclosure is not limited thereto. If the pixel circuits disposed in the second sub-pixel SP2 and the third sub-pixel SP3 are defective, repair may be performed by connecting the pixel circuits of the sub-pixels SP adjacent in the column direction in the same manner as described above.

In the display device 1400 according to still another exemplary aspect of the present disclosure, the pixel electrode PE of the sub-pixel SP is disposed to overlap with the sub-pixel SP disposed in a column adjacent thereto. Accordingly, when the light emitting element LED is not driven due to a defect in a pixel circuit or a poor contact between the light emitting element LED and the pixel circuit in the first sub pixel SP1, the sub-pixel SP where a defect occurs may be easily repaired by using the second assembly electrode 123 among the assembly electrodes 120 of the sub pixel SP that is not driven. For example, when the first light emitting element 130 of the first sub-pixel SP1 does not emit light, repair may be performed by connecting it to the pixel circuit of the light emitting element LED disposed on the upper side of the first sub-pixel pixel SP1.

In addition, in the display device 1400 according to still another exemplary aspect of the present disclosure, the light emitting element LED of the sub-pixel SP where a color mixing defect occurs is connected to the pixel circuit of the sub-pixel SP adjacent thereto by using the second assembly electrode 123 without further disposing a separate structure, so that a structure of the display device 1400 may be simplified.

The exemplary aspects of the present disclosure may also be described as follows:

According to an aspect of the present disclosure, there is provided a display device. The display device comprises a substrate including a plurality of sub-pixels, a pixel circuit disposed in each of the plurality of sub-pixels on the substrate, a first light emitting element disposed in each of the plurality of sub-pixels, disposed on one side of the pixel circuit, and including a first electrode, a semiconductor layer, and a second electrode, a second light emitting element disposed in each of the plurality of sub-pixels, disposed on the other side of the pixel circuit, and including a first electrode, a semiconductor layer, and a second electrode and a pixel electrode electrically connected to the pixel circuit and extending to the first light emitting element and the second light emitting element.

The size of the first light emitting element may be identical to the size of the second light emitting element, wherein the pixel electrode is connected to both the first light emitting element and the second light emitting element.

The size of the first light emitting element may be different from the size of the second light emitting element, wherein the pixel electrode is connected to one of the first light emitting element and the second light emitting element.

The display device may further comprise a first assembly electrode and a second assembly electrode disposed to be spaced apart from each other below the first light emitting element and the second light emitting element, wherein the first electrode of the first light emitting element and the first electrode of the second light emitting element are electrically connected to the first assembly electrode and insulated from the second assembly electrode.

The plurality of sub-pixels may be disposed such that a first sub-pixel disposed in a first column, a second sub-pixel disposed in a second column, and a third sub-pixel disposed in a third column are repeated in a row direction, and the pixel electrode may be include, a first portion extending to the first light emitting element and the second light emitting element, a second portion disposed to overlap with the second assembly electrode of the sub-pixel in which the pixel electrode is disposed, and a third portion extending from the first portion and disposed to overlap with the second assembly electrode of the sub-pixel disposed in a column adjacent to the sub-pixel in which the pixel electrode is disposed.

The second portion and the third portion of the pixel electrode may be insulated from the second assembly electrode.

When sizes of the first light emitting element and the second light emitting element of the first sub-pixel are different from each other, and the size of the first light emitting element of the first sub-pixel is identical to the size of the first light emitting element of the second sub-pixel, the second portion of the pixel electrode of the first sub-pixel may be electrically connected to the second assembly electrode of the first sub-pixel, and the third portion of the pixel electrode of the second sub-pixel may be electrically connected to the second assembly electrode of the first sub-pixel.

The first portion of the pixel electrode of the first sub-pixel may be electrically connected only to the second light emitting element among the first light emitting element and the second light emitting element of the first sub-pixel.

The second assembly electrode of the first sub-pixel may be separated from the second assembly electrode of another first sub-pixel adjacent thereto in the row direction.

When sizes of the first light emitting element and the second light emitting element of the first sub-pixel are different from each other, and the size of the first light emitting element of the first sub-pixel is identical to the size of the first light emitting element of the third sub-pixel, the third portion of the pixel electrode of the first sub-pixel may be electrically connected to the second assembly electrode of the third sub-pixel, and the second portion of the pixel electrode of the third sub-pixel may be electrically connected to the second assembly electrode of the third sub-pixel.

The first portion of the pixel electrode of the first sub-pixel may be electrically connected only to the second light emitting element among the first light emitting element and the second light emitting element of the first sub-pixel.

The second assembly electrode of the third sub-pixel may be separated from the second assembly electrode of another third sub-pixel adjacent thereto in the row direction.

When sizes of the first light emitting element and the second light emitting element of the second sub-pixel are different from each other, and the size of the first light emitting element of the second sub-pixel is identical to the size of the first light emitting element of the third sub-pixel, the second portion of the pixel electrode of the second sub-pixel may be electrically connected to the second assembly electrode of the second sub-pixel, and the third portion of the pixel electrode of the third sub-pixel may be electrically connected to the second assembly electrode of the second sub-pixel.

The second assembly electrode of the second sub-pixel may be separated from the second assembly electrode of another second sub-pixel adjacent thereto in the row direction.

The first portion of the pixel electrode of the second sub-pixel may be electrically connected only to the second light emitting element among the first light emitting element and the second light emitting element of the second sub-pixel.

When the pixel circuit of one sub-pixel among the plurality of sub-pixels is defective, the second portion of the pixel electrode of the one sub-pixel may be electrically connected to the second assembly electrode, and the second portion of the pixel electrode of another sub-pixel adjacent to the one sub-pixel in a column direction may be electrically connected to the second assembly electrode.

The second assembly electrodes of the one sub-pixel and the other sub-pixel may be separated from the second assembly electrodes of other sub-pixels adjacent to thereto in a column direction.

Although the exemplary aspects of the present disclosure have been described in detail with reference to the accompanying drawings, the present disclosure is not limited thereto and may be embodied in many different forms without departing from the technical concept of the present disclosure. Therefore, the exemplary aspects of the present disclosure are provided for illustrative purposes only but not intended to limit the technical concept of the present disclosure. The scope of the technical concept of the present disclosure is not limited thereto. Therefore, it should be understood that the above-described exemplary aspects are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A display device, comprising:

a substrate including a plurality of pixels, each of the plurality of pixels including a plurality of sub-pixels, each of the plurality of sub-pixels including a first sub-pixel, a second sub-pixel and a third sub-pixel that emit light of different colors;

a pixel circuit disposed in each of the first sub-pixel, the second sub-pixel and the third sub-pixel;

a first light emitting element disposed in each of the first sub-pixel, the second sub-pixel and the third sub-pixel, that is disposed on one side of the pixel circuit;

a second light emitting element disposed in each of the first sub-pixel, the second sub-pixel and the third sub-pixel, that is disposed on another side of the pixel circuit; and a pixel electrode electrically connected to the pixel circuit and extending to the first light emitting element and the second light emitting element.

2. The display device of claim 1, wherein the first light emitting element has a same size as the second light emitting element, and wherein the pixel electrode is connected to the first and second light emitting elements.

3. The display device of claim 1, wherein the first light emitting element has a different size from the second light emitting element, wherein the pixel electrode is connected to one of the first light emitting element and the second light emitting element.

4. The display device of claim 1, further comprising a first assembly electrode and a second assembly electrode spaced apart from each other and respectively disposed below the first light emitting element and the second light emitting element, wherein a first electrode of the first light emitting element and a first electrode of the second light emitting element are electrically connected to the first assembly electrode and separated from the second assembly electrode.

5. The display device of claim 4, wherein the pixel electrode comprises:

a first portion extending to the first light emitting element and the second light emitting element, a second portion overlapping with the second assembly electrode of the sub-pixel in which the pixel electrode is disposed, and a third portion extending from the first portion and overlapping with the second assembly electrode of the sub-pixel disposed in a column adjacent to the sub-pixel in which the pixel electrode is disposed.

6. The display device of claim 5, wherein the second portion and the third portion of the pixel electrode are separated from the second assembly electrode.

7. The display device of claim 5, wherein the plurality of sub-pixels are disposed such that a first sub-pixel disposed in a first column, a second sub-pixel disposed in a second column, and a third sub-pixel disposed in a third column are repeated in a row direction, and wherein, when sizes of the first light emitting element and the second light emitting element of the first sub-pixel are different from each other, and the size of the first light emitting element of the first sub-pixel is same as the size of the first light emitting element of the second sub-pixel, the second portion of the pixel electrode of the first sub-pixel is electrically connected to the second assembly electrode of the first sub-pixel, and the third portion of the pixel electrode of the second sub-pixel is electrically connected to the second assembly electrode of the first sub-pixel.

8. The display device of claim 7, wherein the first portion of the pixel electrode of the first sub-pixel is electrically connected only to the second light emitting element among the first light emitting element and the second light emitting of the first sub-pixel.

9. The display device of claim 7, wherein the second assembly electrode of the first sub-pixel is separated from the second assembly electrode of another first sub-pixel adjacent thereto in the row direction.

10. The display device of claim 5, wherein the plurality of sub-pixels are disposed such that a first sub-pixel disposed in a first column, a second sub-pixel disposed in a second column, and a third sub-pixel disposed in a third column are repeated in a row direction, and wherein, when sizes of the first light emitting element and the second light emitting element of the first sub-pixel are different from each other, and the size of the first light emitting element of the first sub-pixel is identical to the size of the first light emitting element of the third sub-pixel, the third portion of the pixel electrode of the first sub-pixel is electrically connected to the second assembly electrode of the third sub-pixel, and the second portion of the pixel electrode of the third sub-pixel is electrically connected to the second assembly electrode of the third sub-pixel.

11. The display device of claim 10, wherein the first portion of the pixel electrode of the first sub-pixel is electrically connected only to the second light emitting element among the first light emitting element and the second light emitting element of the first sub-pixel.

12. The display device of claim 10, wherein the second assembly electrode of the third sub-pixel is separated from the second assembly electrode of another third sub-pixel adjacent thereto in the row direction.

13. The display device of claim 5, wherein the plurality of sub-pixels are disposed such that a first sub-pixel disposed in a first column, a second sub-pixel disposed in a second column, and a third sub-pixel disposed in a third column are repeated in a row direction, and when sizes of the first light emitting element and the second light emitting element of the second sub-pixel are different from each other, and the size of the first light emitting element of the second sub-pixel is identical to the size of the first light emitting element of the third sub-pixel, the second portion of the pixel electrode of the second sub-pixel is electrically connected to the second assembly electrode of the second sub-pixel, and the third portion of the pixel electrode of the third sub-pixel is electrically connected to the second assembly electrode of the second sub-pixel.

14. The display device of claim 13, wherein the second assembly electrode of the second sub-pixel is separated from the second assembly electrode of another second sub-pixel adjacent thereto in the row direction.

15. The display device of claim 13, wherein the first portion of the pixel electrode of the second sub-pixel is electrically connected only to the second light emitting element among the first light emitting element and the second light emitting element of the second sub-pixel.

16. The display device of claim 5, wherein the plurality of sub-pixels are disposed such that a first sub-pixel disposed in a first column, a second sub-pixel disposed in a second column, and a third sub-pixel disposed in a third column are repeated in a row direction, and wherein when the pixel circuit of one sub-pixel among the plurality of sub-pixels is defective or electrical connection between the pixel circuit and the first light emitting element or the second light emitting element is defective, the second portion of the pixel electrode of the one sub-pixel is electrically connected to the second assembly electrode;

the second portion of the pixel electrode of another sub-pixel adjacent to the one subpixel in a column direction is electrically connected to the second assembly electrode.

17. The display device of claim 16, wherein the second assembly electrodes of the one sub-pixel and the other sub-pixel are separated from the second assembly electrodes of other sub-pixels adjacent to thereto in a column direction.

18. The display device of claim 16, wherein the first portion of the pixel electrode of the first sub-pixel is electrically connected only to the second light emitting element among the first light emitting element and the second light emitting element of the first sub-pixel.

19. The display device of claim 5, wherein the second part and the third part is formed by performing a repair process by irradiating laser when a pixel circuit of one sub-pixel has a defect.

20. A display device, comprising:

a substrate including a plurality of pixels, each of the plurality of pixels including a plurality of sub-pixels, each of the plurality of sub-pixels including a first sub-pixel, a second sub-pixel and a third sub-pixel that emit light of different color;

a pixel circuit disposed in each of the first sub-pixel, the second sub-pixel and the third sub-pixel;

a first light emitting element disposed in each of the first sub-pixel, the second sub-pixel and the third sub-pixel disposed on one side of the pixel circuit;

a second light emitting element disposed in each of the first sub-pixel, the second sub-pixel and the third sub-pixel disposed on another side of the pixel circuit;

a pixel electrode electrically connected with the pixel circuit and at least one of the first light emitting element and the second light emitting element;

a connection electrode electrically connecting the pixel electrode and a transistor of the pixel circuit;

a first assembly electrode electrically connected to the first light emitting element; and a second assembly electrode separated from the first assembly electrode and electrically connected to the second light emitting element, wherein the first assembly electrode, the second assembly electrode and the connection electrode are disposed on a same layer.

* * * * *